(12) United States Patent
Lee et al.

(10) Patent No.: US 7,428,092 B2
(45) Date of Patent: Sep. 23, 2008

(54) FAST-RESPONSE MICRO-MECHANICAL DEVICES

(75) Inventors: Chii Guang Lee, Fremont, CA (US);
Chun-Teh Kao, Cupertino, CA (US);
Hung Kwei Hu, Saratoga, CA (US);
Shaoher X. Pan, San Jose, CA (US)

(73) Assignee: Spatial Photonics, Inc., Sunnyvale, CA (US)

( * ) Notice: Subject to any disclaimer, the term of this patent is extended or adjusted under 35 U.S.C. 154(b) by 306 days.

(21) Appl. No.: 11/292,329

(22) Filed: Nov. 30, 2005

(65) Prior Publication Data

US 2007/0121192 A1    May 31, 2007

(51) Int. Cl.
*G02B 26/00*    (2006.01)
(52) U.S. Cl. ................... 359/290; 359/292; 359/295; 359/298; 359/318
(58) Field of Classification Search ................. 359/223, 359/224, 290–292, 295, 298, 315, 316, 318
See application file for complete search history.

(56) References Cited

U.S. PATENT DOCUMENTS

| | | | |
|---|---|---|---|
| 6,992,810 | B2 | 1/2006 | Pan et al. |
| 7,167,298 | B2 * | 1/2007 | Pan ............................ 359/291 |
| 2003/0160540 | A1 | 8/2003 | Miller et al. |
| 2004/0214350 | A1 | 10/2004 | Pan et al. |
| 2005/0104144 | A1 | 5/2005 | Yang et al. |
| 2005/0128564 | A1 | 6/2005 | Pan |
| 2007/0121191 | A1 | 5/2007 | Pan |
| 2007/0127110 | A1 | 6/2007 | Pan |
| 2007/0132681 | A1 | 6/2007 | Chen |
| 2007/0206265 | A1 | 9/2007 | Pan et al. |

OTHER PUBLICATIONS

European Search Report, EP Application Serial No. EP 06 02 4826, Feb. 27, 2007, 2 pp.

* cited by examiner

*Primary Examiner*—Evelyn A. Lester
(74) *Attorney, Agent, or Firm*—Fish & Richardson P.C.

(57) ABSTRACT

A spatial light modulator includes a mirror plate comprising a reflective upper surface, a lower surface having a conductive surface portion, and a substrate portion having a first cavity having an opening on the lower surface, a second cavity in the substrate portion, and a membrane over the second cavity. The modulator includes a substrate comprising an upper surface, a hinge support post in connection with the upper surface, a hinge component supported by the hinge support post and in connection with the mirror plate to facilitate a rotation of the mirror plate, and an upright landing tip in connection with the upper surface of the substrate. The hinge component is extends into the first cavity. The upright landing tip is configured to contact the membrane over the second cavity in the substrate portion of the mirror plate to stop the rotation of the mirror plate at a predetermined orientation.

25 Claims, 17 Drawing Sheets cross section view of a part of the spatial light modulator according to one embodiment of the present invention deflecting illumination to an "on" state.

cross section view of a part of the spatial light modulator according to one embodiment of the present invention deflecting illumination to an "off" state.

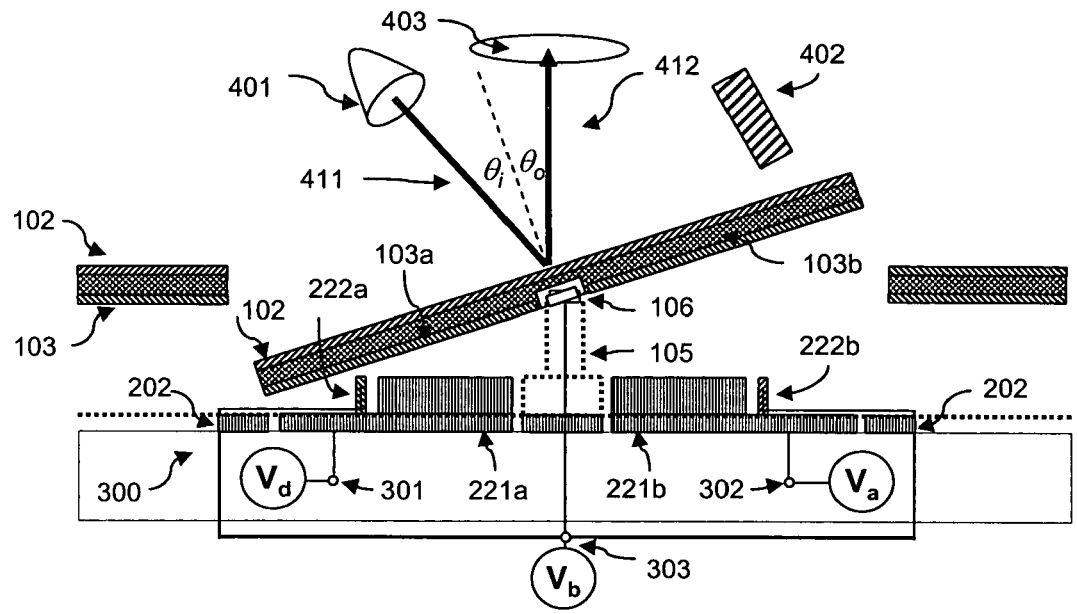
Fig. 1a: cross section view of a part of the spatial light modulator according to one embodiment of the present invention deflecting illumination to an "on" state.
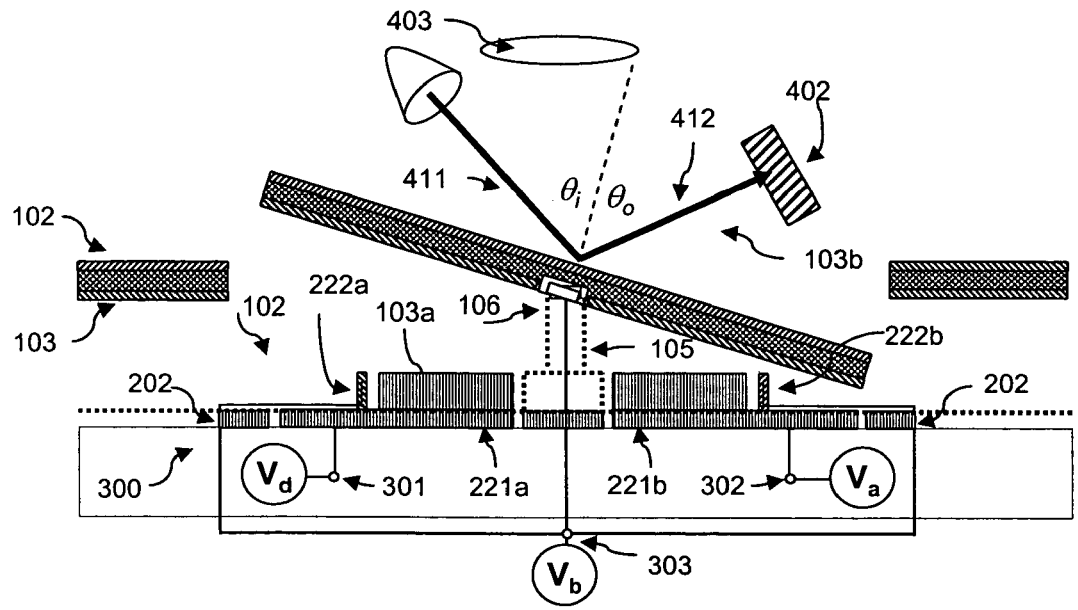
Fig. 1b: cross section view of a part of the spatial light modulator according to one embodiment of the present invention deflecting illumination to an "off" state.

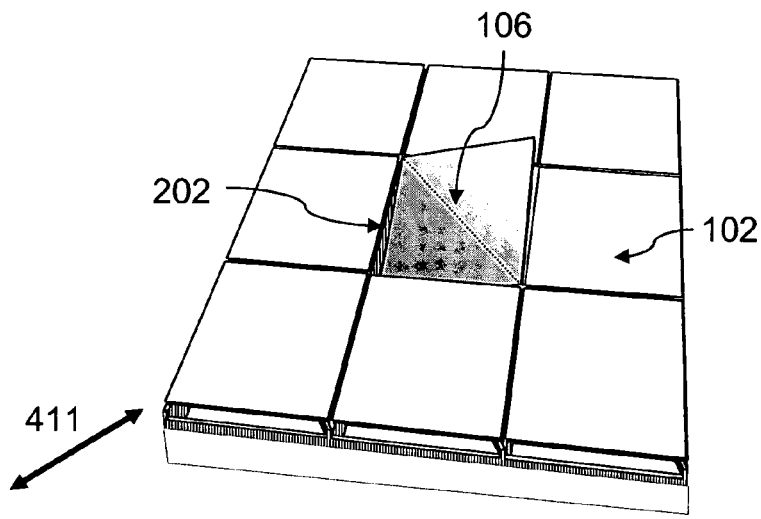
Fig. 2: A perspective view showing the top of a part of the arrays of rectangular shape mirrors for a projection system with diagonal illumination configuration.
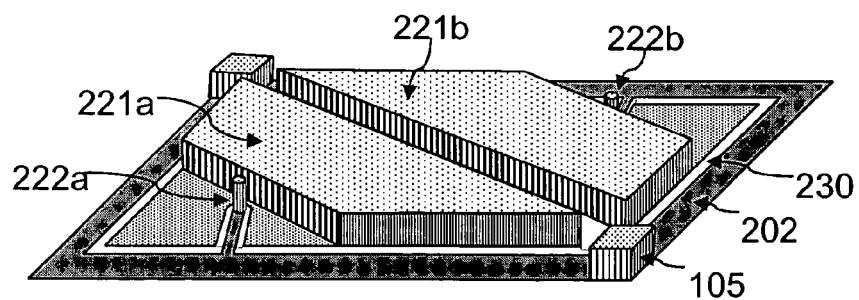
Fig. 3: A perspective view showing the top of a part of the control circuitry substrate for a projection system with diagonal illumination configuration.

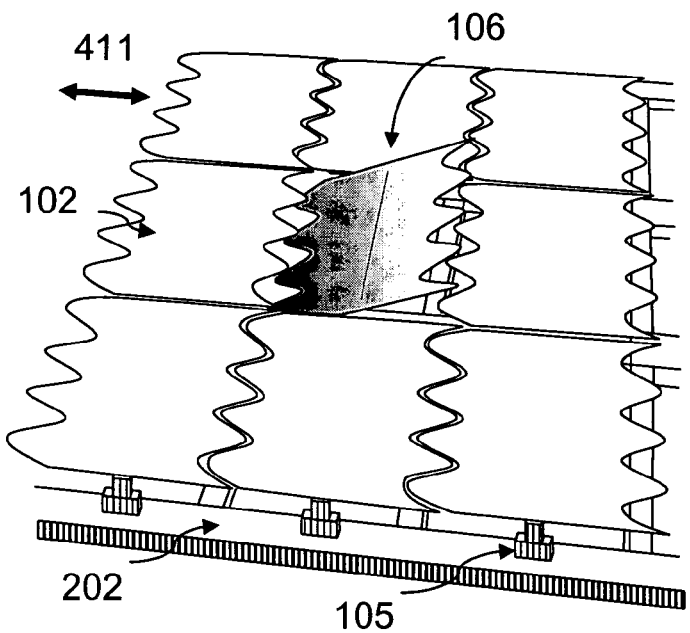

Fig. 4: A perspective view showing the top of a part of the mirror array with each mirror having a series of curvature shapes leading and trailing edges for a projection system with orthogonal illumination configuration.

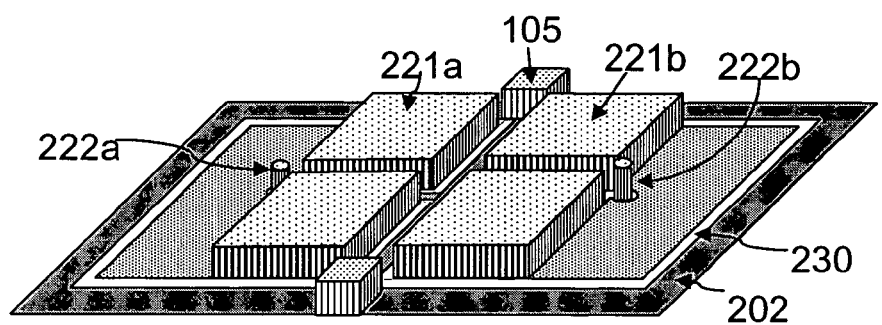

Fig. 5: A perspective view showing the top of a part of the control circuitry substrate for a projection system with orthogonal illumination configuration.

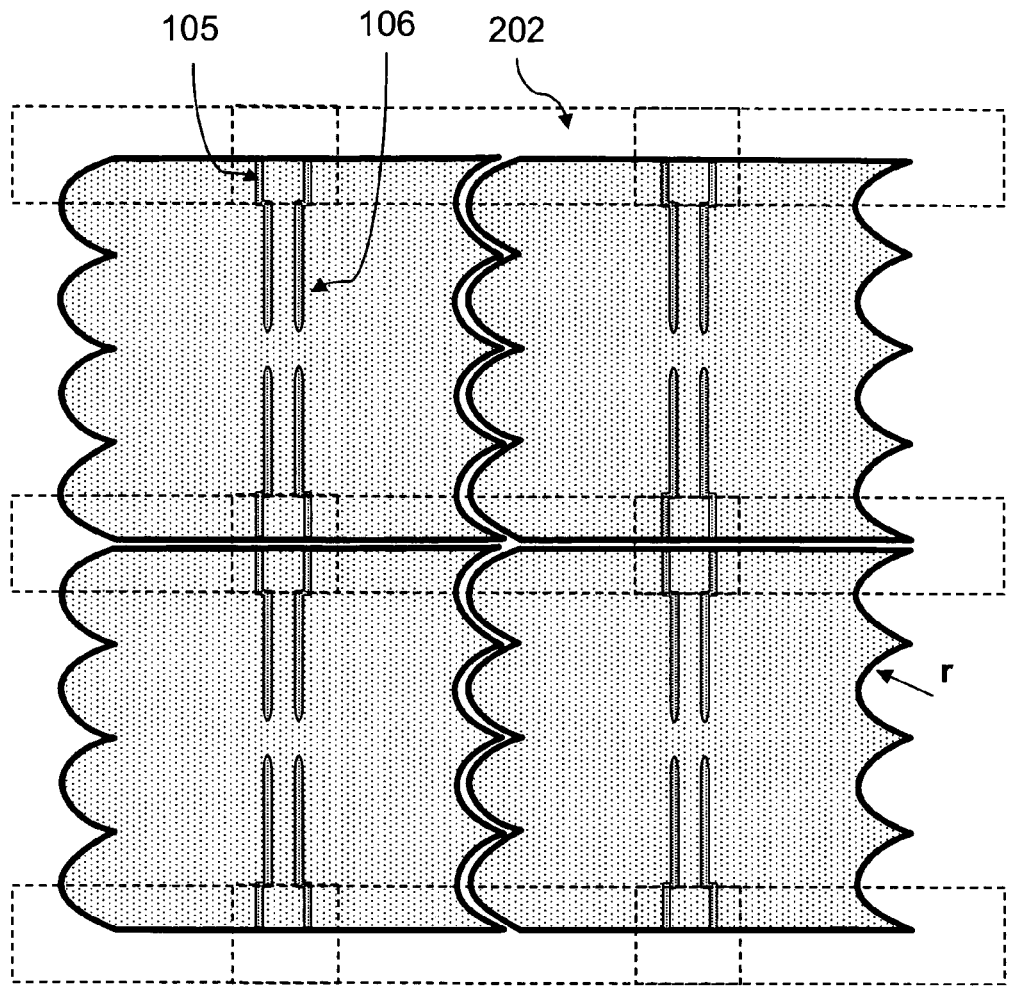
Fig. 6: An enlarged backside view of a part of the mirror array with each mirror having a series of curvature shapes leading and trailing edges for a projection system with orthogonal illumination configuration.

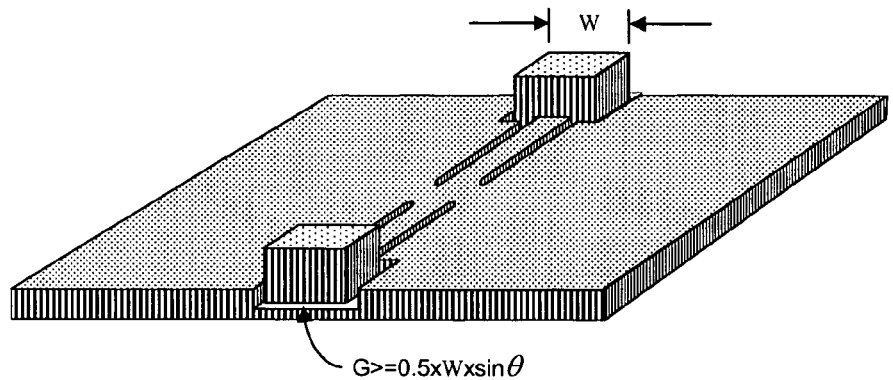
Fig. 7: A perspective view showing the embedded torsion hinges and their support posts under the cavities in the lower portion of a mirror plate.
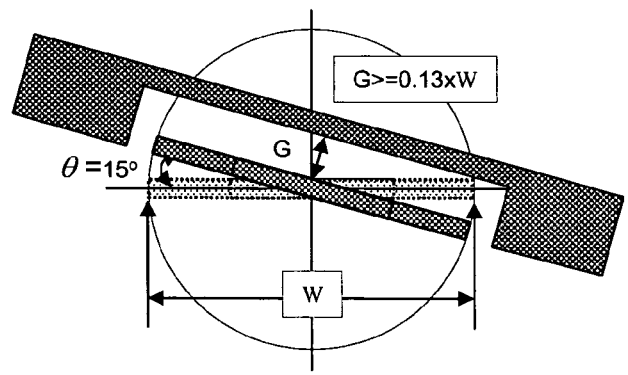
Fig. 8: A diagram illustrates a minimum air gap spacing around the embedded torsion hinge of a mirror plate when rotated 15° in one direction.

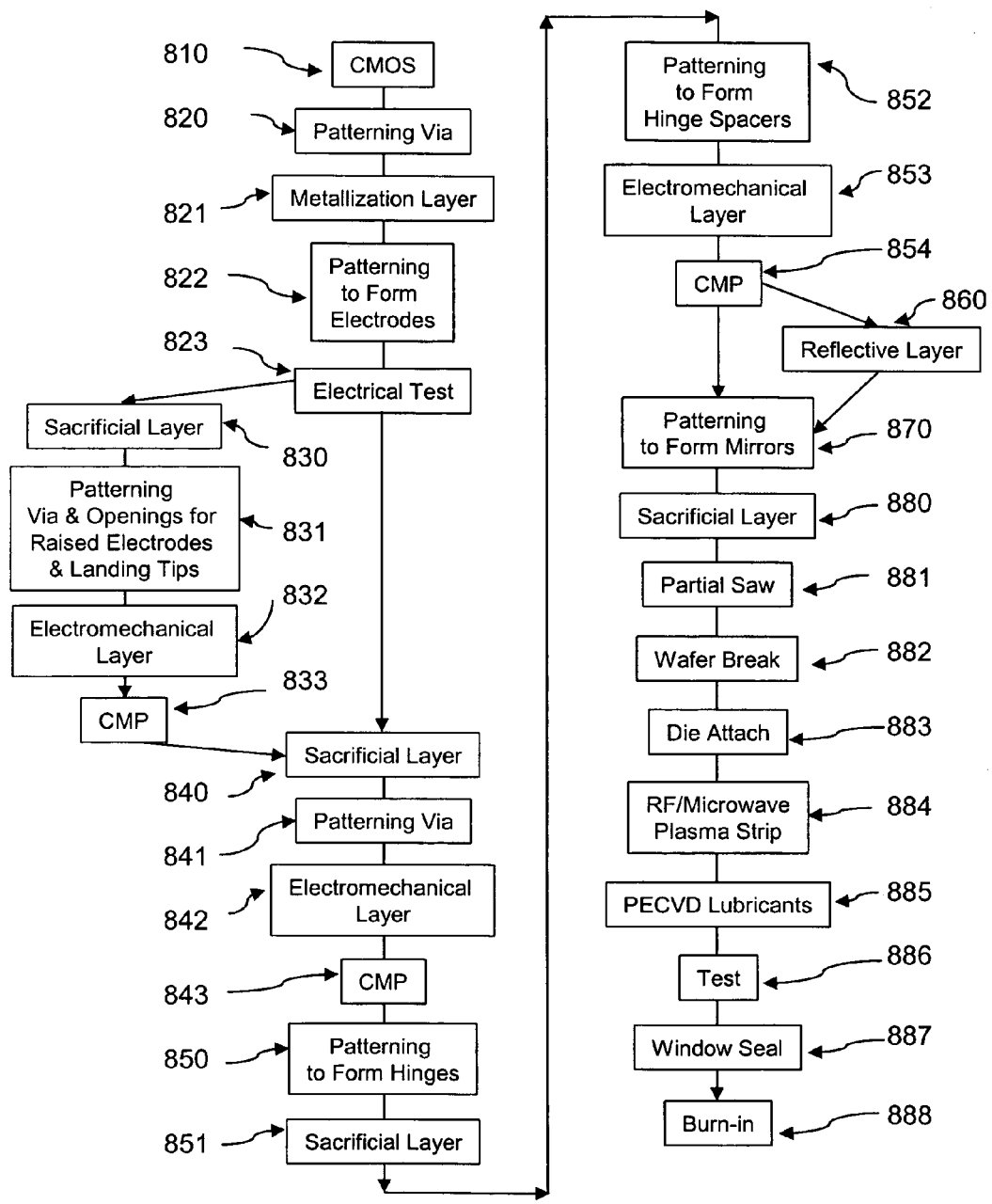
Fig. 9: A manufacturing process flow diagram for a high contrast SLM.

Fig. 10-13: Cross section side views of a part of a spatial light modulator illustrating one method for fabricating a plurality of support frames and the first level electrodes connected to the memory cells in the addressing circuitry.

Fig. 14-17: Cross section side views of a part of a spatial light modulator illustrating one method for fabricating a plurality of support posts, second level electrodes, and landing tips on the surface of control substrate.

Fig. 18-20: Cross section side views of a part of a spatial light modulator illustrating one method for fabricating a plurality of torsion hinges and its supports on the support frame.

Fig. 21-23: Cross section side views of a part of a spatial light modulator illustrating one method for fabricating a mirror plate with a plurality of embedded hidden hinges.

Fig. 24-26: Cross section side views of a part of a spatial light modulator illustrating one method for forming the reflective mirrors and releasing individual mirrors of a micro mirror array.

FAST-RESPONSE MICRO-MECHANICAL DEVICES

BACKGROUND

The present specification relates to spatial light modulators.

Over the past fifteen to twenty years, micro mirror based spatial light modulator (SLM) technology has undergone many incremental technical advancements and gained greater acceptance in the display industry. The devices operate by tilting individual micro mirror plates in the array around a torsion hinge with an electrostatic torque to deflect the incident light to a predetermined exit direction. In a more popular digital mode operation, the light is turned "on" or "off" by rotating selectively the individual mirrors in a micro mirror array and mechanically stopped at a specific landing position to ensure the precision of deflection angles. A functional micro mirror array requires low contact sticking forces at the mechanical stops and high efficiency of electrostatic torques to control timing, to overcome surfaces contact adhesions, and to ensure the robotics and reliability. A high performance spatial light modulator for display application produces high brightness and high contrast ratio videos images.

Early SLM in video applications suffered a disadvantage of low brightness and low contrast ratio of the projected images. Previous SLM design typically has a low active reflection area fill-ratio of pixels (e.g., ratio between active reflective areas and non-active areas in each pixel). A large inactive area around each pixel in the array of SLM results to a low optical coupling efficiency and low brightness. The scattered light from these inactive areas in the array forms diffraction patterns that adversely impact the contrast of video images. Another major source of the reduced contrast ratio of micro mirror array based SLM is the diffraction of the scattered light from two straight edges of each mirror in the array that are perpendicular to the incident illumination. In a traditional square shape mirror design, an orthogonal incident light is scattered directly by the perpendicular straight leading and trailing edges of each mirrors in the array during the operation. The scattered light produces a diffraction pattern and much of the diffracted light is collected by the projection lenses. The bright diffraction pattern smears out the high contrast of projected video images.

One type of micro mirror based SLM is the Digital Mirror Device (DMD), developed by Texas Instruments and described by Hornbeck. The most recent implementations include a micro mirror plate suspended via a rigid vertical support post on top of a yoke plate. The yoke plate is further comprised a pair of torsion hinges and two pair of horizontal landing tips above addressing electrodes. The electrostatic forces on the yoke plate and mirror plate controlled by the voltage potentials on the addressing electrodes cause the bi-directional rotation of both plates. The double plate structure is used to provide an approximately flat mirror surface that covers the underlying circuitry and hinge mechanism, which is one way in order to achieve an acceptable contrast ratio.

However, the vertical mirror support post which elevated the mirror plate above the hinge yoke plate has two negative impacts on the contrast ratio of the DMD. First, a large dimple (caused by the fabrication of mirror support post) is present at the center of the mirror in current designs which causes scattering of the incident light and reduces optical efficiency. Second, the rotation of double plate causes a horizontal displacement of mirror reflective surfaces along the surface of DMD, resulting in a horizontal vibration of a micro mirror during operation. The horizontal movement of mirrors requires extra larger gaps to be design in between the mirrors in the array, reducing the active reflection area fill-ratio further. For example, if the rotation of mirror on each direction is 12°, every one micron apart between the mirror and the yoke resulting a 0.2 microns horizontal displacement on each direction. In other words, more than 0.4 microns extra gap spacing between the adjacent mirrors is required for every one micron length of mirror support post to accommodate the horizontal displacement.

The yoke structure has limited the electrostatic efficiency of the capacitive coupling between the bottom electrodes and the yoke and mirror. Especially in a landing position, it requires a high voltage potential bias between the electrodes and the yoke and mirror to enable the angular cross over transition. Double plate structure scatters incident light which also reduces the contrast ratio of the video images.

Another reflective SLM includes an upper optically transmissive substrate held above a lower substrate containing addressing circuitry. One or more electrostatically deflectable elements are suspended by two hinge posts from the upper substrate. In operation, individual mirrors are selectively deflected and serve to spatially modulate light that is incident to, and then reflected back through, the upper transmissive substrate. Motion stops may be attached to the reflective deflectable elements so that the mirror does not snap to the bottom control substrate. Instead, the motion stop rests against the upper transmissive substrate thus limiting the deflection angle of the reflective deflectable elements.

In such top hanging mirror design, the mirror hanging posts and mechanical stops are all exposed to the light of illumination, which reduces the active reflection area fill-ratio and optical efficiency, and increase the light scattering. It is also difficult to control the smoothness of reflective mirror surfaces, which is sandwiched between the deposited aluminum film and LPCVD silicon nitride layers. Deposition film quality determines the roughness of reflective aluminum surfaces. No post-polishing can be done to correct the mirror roughness.

SUMMARY

To overcome the previously discussed weakness in the prior art devices, a high contrast spatial light modulator for display and printing is fabricated by coupling a high active reflection area fill-ratio and non-diffractive micro mirror array with a high electrostatic efficiency and low surface adhesion control substrate. In one aspect, the present invention relates to a spatial light modulator, including a mirror plate comprising a reflective upper surface, a lower surface having a conductive surface portion, and a substrate portion having a first cavity having an opening on the lower surface, a second cavity in the substrate portion, and a membrane over the second cavity; a substrate comprising an upper surface, a hinge support post in connection with the upper surface, and a hinge component supported by the hinge support post and in connection with the mirror plate to facilitate a rotation of the mirror plate, wherein the hinge component is configured to extend into the first cavity to facilitate a rotation of the mirror plate; and an upright landing tip in connection with the upper surface of the substrate, wherein the upright landing tip is configured to contact the membrane over the second cavity in the substrate portion of the mirror plate to stop the rotation of the mirror plate a predetermined orientation.

In another aspect, the present invention relates to a spatial light modulator, including a two-dimensional array of mirror plates, each comprising a reflective upper surface, a lower surface having a conductive surface portion, and a substrate portion having one or more first cavities having openings on the lower surface, one or more second cavities in the substrate portion, and membranes over the second cavities; a substrate comprising an upper surface, a plurality of electrodes over the upper surface, a plurality of hinge support posts over the upper surface, and a plurality of hinge components each supported by one of the hinge support posts, wherein each of the hinge components is configured to extend into the first cavities in the substrate portion of one of the mirror plates in the two-dimensional array to facilitate a rotation of the mirror plate; and a plurality of upright landing tips in connection with the upper surface of the substrate, wherein each of the upright landing tips is configured to contact one of the membranes over the second cavities in the substrate portion of one of the mirror plates to stop the rotation of the mirror plate at one or more predetermined orientations when an electric voltage is applied across one of the electrodes over the substrate and the conductive surface portion in the lower surface of the mirror plate.

In yet another aspect, the present invention relates to a method of fabricating a spatial light modulator including a mirror plate having a first cavity having an opening on the lower surface, a second cavity, and a membrane over the second cavity; and a hinge support post in connection with the upper surface of the substrate, and a hinge component supported by the hinge support post and in connection with the mirror plate to facilitate a rotation of the mirror plate, wherein the hinge component is configured to extend into the first cavity to facilitate a rotation of the mirror plate; and a landing tip in connection with the upper surface of the substrate, wherein the landing tip is configured to contact the membrane over the second cavity in the substrate portion of the mirror plate to stop the rotation of the mirror plate a predetermined orientation.

The method includes depositing a first sacrificial materials over the substrate to form a first sacrificial layer; patterning the first sacrificial layer to form holes in the first sacrificial layer; hardening the first sacrificial layer; depositing a first electromechanical material to form a hinge support post and a landing tip in the holes in the first sacrificial layer; depositing a second electromechanical material to form a second electromechanical layer over the first sacrificial layer and the first electromechanical material; patterning the second electromechanical layer to form a hinge component and opening gaps around the hinge component; depositing a second sacrificial material over the second electromechanical layer; patterning the second sacrificial material to form a first spacer on top of the hinge component and a second spacer from which the second cavity and the membrane are to be formed in the mirror plate; hardening the second sacrificial layer; depositing a third electromechanical material over the second sacrificial material to form a third electromechanical layer from which the mirror plate is to be formed; patterning the third electromechanical layer to form around the mirror plate; and removing the first sacrificial material and the second sacrificial material to form a mirror plate having the second cavity and the membrane over the second cavity, the hinge support post in connection with the substrate, a hinge component supported by the hinge support post and in connection with the mirror plate, and the landing tip in connection with the upper surface of the substrate.

Implementations of the system may include one or more of the following. The first cavity in the substrate portion of the mirror plate and the associated hinge component can be so configured such that a gap is formed between the hinge component and the surfaces in the first cavity to permit the rotation of the mirror plate. The spatial light modulator can further include an electrode over the upper surface of the substrate. The upright landing tip can be configured to contact the membrane over the second cavity in the substrate portion of the mirror plate to stop the rotation of the mirror plate a predetermined orientation when an electric voltage is applied between the electrode over the substrate and the conductive surface portion in the lower surface of the mirror plate. The membrane over the second cavity in the substrate portion of the mirror plate is configured to be deformed by the upright landing tip when the mirror plate is pulled by an electrostatic force produced by the electric voltage and stopped by the upright landing tip. The membrane can be configured to restore the deformation and to produce an elastic force against the upright landing tips. The membrane can partially cover the second cavities in the substrate portion of the mirror plate, leaving one or more openings in the second cavities at the lower surface of the mirror plate. The membrane can comprise a material selected from the group of titanium, tantalum, tungsten, molybdenum, an alloy, silicon, amorphous silicon, polysilicon, and silicon nitride. The membrane over the second cavity of the substrate portion of the mirror plate can include substantially the same material as the substrate portion of the mirror plate. The substrate can include two hinge components each supported by one of the hinge support posts, each of the hinge components being configured to extend into a first cavity in the substrate portion of the mirror plate. The mirror plate can be configured to rotate around an axis defined by the two hinge components positioned in the two first cavities plate. The substrate can include a first electrode and a second electrode over the upper surface. The substrate portion of the mirror plate can include two or more second cavities each at least partially covered by a membrane. The mirror plate can be configured to rotate in a first direction when a first electric voltage is applied across the first electrode and the conductive surface portion in the lower surface of the mirror plate and the mirror plate is configured to rotate in a second direction when a second electric voltage is applied across the second electrode and the conductive surface portion in the lower surface of the mirror plate. The first one of the upright landing tips can be configured to stop the mirror plate rotating in the first direction by contacting a first membrane over one of the second cavities and the second one of the upright landing tips can be configured to stop the mirror plate rotating in the second direction by contacting a second membrane over another one of the second cavities. The mirror plate, the hinge component, or the hinge support post can include a material selected from the group consisting of aluminum, silicon, amorphous silicon, polysilicon, and an aluminum-silicon alloy.

Embodiments may include one or more of the following advantages. The disclosed system and methods provide a spatial light modulator (SLM) having a high active reflection area fill-ratio. A pair of torsion hinges extends into the cavities to be part of the lower portion of a mirror plate, and are kept in a minimum distance under the reflective surface to allow only a gap for a predetermined angular rotation. The mirror plate in the array is suspended by a pair of torsion hinges supported by two posts to allow the mirror plate rotate along an axis in the mirror plane. By eliminating the horizontal displacement of individual mirror during the cross over transition, the gaps between adjacent mirrors in the array are significantly reduced, which results in a very high active reflection area fill-ratio of the SLM.

The disclosed system and methods provide ways to prevent mirror-substrate adhesion and increase the response time of the micro-mirrors. A pair of vertical landing tips is fabricated on the surface of control substrate. These vertical landing tips reduce the contact area of mirrors during the mechanical stops, and improve the reliability of mechanical landing operation. Most importantly, these landing tips enable a mirror landing separation by applying a sharp bipolar pulsing voltage on a common bias 303 of mirror array. The kinetic energy of the electromechanical shock generated by bipolar pulsing is converted into the elastic strain energy stored in the deformed mirror hinges and deformed landing tips, and released later on to spring and bounce the mirror separating from the landing tips.

The stiction between the landing tips and the mirror plate can be further reduced by a membrane bridged over a cavity fabricated on the underside of the mirror plate. A landing tip comes to contact with the membrane to stop the mirror plate at a predetermined orientation when the mirror plate is driven by an electric force under voltage applied between the lower conductive surface of the mirror plate and one or more electrode over the substrate. The electric force exerted on the mirror plate produces a distortion in the membrane, which stores a mechanical potential energy in the membrane. The mechanical potential energy is released to produce a repelling force when the electric voltage is removed or reversed.

Furthermore, the surface contact adhesion between the membrane and micro landing tips is significantly reduced by coating an anti-stiction layer inside the device structures. The mirror plates can therefore quickly tilt from one orientation to another orientation. The system response time is improved.

The disclosed system and methods are compatible with a wide range of applications, such as video displays and printings, display, printing, photo patterning in maskless photolithography, and photonic switches for directing optical signals among different optical fiber channels.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

FIG. 1a illustrates a cross section view of a part of the spatial light modulator according to one embodiment of the present invention deflecting illumination to an "on" state.

FIG. 1b illustrates a cross section view of a part of the spatial light modulator according to one embodiment of the present invention deflecting illumination to an "off" state.

FIG. 2 is a perspective view showing the top of a part of the arrays of rectangular shape mirrors for a projection system with diagonal illumination configuration.

FIG. 3 is a perspective view showing the top of a part of the control circuitry substrate for a projection system with diagonal illumination configuration.

FIG. 4 is a perspective view showing the top of a part of the mirror array with each mirror having a series of curvature shapes leading and trailing edges for a projection system with orthogonal illumination configuration.

FIG. 5 is a perspective view showing the top of a part of the control circuitry substrate for a projection system with orthogonal illumination configuration.

FIG. 6 is an enlarged backside view of a part of the mirror array with each mirror having a series of curvature shapes leading and trailing edges for a projection system with orthogonal illumination configuration.

FIG. 7 is a perspective view showing the torsion hinges and their support posts under the cavities in the lower portion of a mirror plate.

FIG. 8 is a diagram illustrates a minimum air gap spacing around the torsion hinge of a mirror plate when rotated 15° in one direction.

FIG. 9 is a manufacturing process flow diagram for a high contrast spatial light modulator.

Like reference numbers and designations in the various drawings indicate like elements.

DETAILED DESCRIPTION

Figure 10:
FIG. 10-13 are cross section side views of a part of a spatial light modulator illustrating one method for fabricating a plurality of support frames and the first level electrodes connected to the memory cells in the addressing circuitry.
Figure 11:
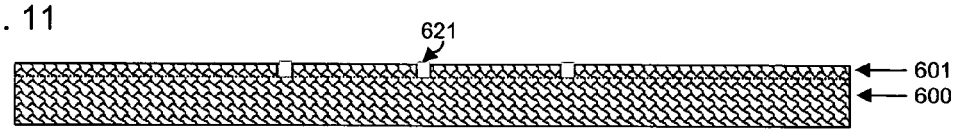

A high contrast spatial light modulator (SLM) for display and printing is fabricated by coupling a high active reflection area fill-ratio and non-diffractive micro mirror array with a high electrostatic efficiency and low surface adhesion control substrate. A cross section view of a part of the spatial light modulator according to one embodiment of the present invention is shown in FIG. 1a, as the directional light 411 of illumination 401 at an angle of incidence θi is deflected 412 at an angle of θo toward normal direction of a micro mirror array. In a digital operation mode, this configuration is commonly called the "on" position. FIG. 1b shows a cross section view of the same part of the spatial light modulator while the mirror plate is rotated toward another electrode under the other side of the hinge 106. The same directional light 411 is deflected to 412 a much larger angles θi and θo predetermined by the dimensions of mirror plate 102 and the air gap spacing between its lower surfaces of mirror 103 to the landing tips 222, and exits toward a light absorber 402.

According to another embodiment of the present invention, the high contrast SLM is consisted of three major portions: the bottom portion of control circuitry, the middle portion of a plurality of step electrodes, micro landing tips, hinge support posts, and the upper portion covered with a plurality of mirrors with hidden torsion hinges and cavities.

The bottom portion is a wafer substrate 300 with addressing circuitries to selectively control the operation of each mirror in the micro mirror array of SLM. The addressing circuitries comprise array of memory cells and word-line/bit-line interconnect for communication signals. The electrical addressing circuitry on a silicon wafer substrate may be fabricated using standard CMOS technology, and resembles a low-density memory array.

The middle portion of the high contrast SLM is formed by arrays of step electrodes 221, landing tips 222, hinge support posts 105, and a support frame 202. The multi-level step electrodes 221 in present invention are designed to improve the capacitive coupling efficiency of electrostatic torques during the angular cross over transition. By raising the electrode 221 surfaces near the hinge 106 area, the air gap spacing between the mirror plate 103 and the electrodes 221 is effectively narrowed. Since the electrostatic attractive force is inversely proportional to the square of the distance between the mirrors and electrodes, this effect becomes apparent when mirror is tilted at its landing positions. When operating in analog mode, high efficient electrostatic coupling allows a more precise and stable control of the tilting angles of the individual micro mirror in the spatial light modulator. In a digital mode, it requires much lower driving voltage potential in addressing circuitry to operate. The height differences between the first level electrodes 221 to the second may vary from 0.2 microns to 3 microns depends on the relative height of air gap between the first level electrodes to the mirror plate.

On the surfaces of control substrate, a pair of stationary vertical landing tips 222a and 222b is designed to have same height as that of second level electrodes 221 for manufacturing simplicity. A pair of stationary vertical tips 222a and 222b has two functions. The vertical micro tips provide a gentle mechanical touch-down for the mirror to land on each angular cross over transition at a pre-determined angle precisely. Adding a stationary landing tip 222 on the surface of control substrate enhances the robotics of operation and prolongs the reliability of the devices. The second function of these vertical landing tips 222 is providing a mechanism to allow an ease of separation between the mirror 103 and its contact stop 222, which effectively eliminates the contact surface adhesion during a digital operation of SLM. For example, to initiate an angular cross over transition, a sharp bipolar pulse voltage Vb is applied on the bias electrode 303, typically connected to each mirror plate 103 through its torsion hinges 106 and support posts 105. The voltage potential established by the bipolar bias Vb enhances the electrostatic forces on both side of the hinge 106. This strengthening is unequal on two sides at the landing position, due to the large difference in air gap spacing. Though the increases of bias voltages Vb on the lower surface of mirror plate 103a and 103b has less impact on which direction the mirror 102 will rotate toward, a sharp increase of electrostatic forces F on the whole mirror plate 102 provides a dynamic excitation by converting the electromechanical kinetic energy into an elastic strain energy stored in the deformed mirror hinges 106 and deformed micro landing tips 222a or 222b. After a bipolar pulse is released on the common bias Vb, the elastic strain energy of deformed landing tip 222a or 222b and deformed mirror hinges 106 is converted back to the kinetic energy of mirror plate as it springs and bounces away from the landing tip 222a or 222b. This perturbation of mirror plate toward the quiescent state enables a much smaller address voltage potential Va for angular cross over transition of mirror plate 103 from one state to the other.

Hinge support frame 202 on the surface of control substrate 300 is designed to strengthen the mechanical stability of the pairs of mirror support posts 105, and retained the electrostatic potentials locally. For the simplicity, the height of support frames 202 is designed to be the same as the first level electrodes 221. With a fixed size of mirror plate 103, the height of a pair of hinge support posts 105 will determine the maximum deflection angles θ of a micro mirror array.

The upper portion of the high contrast SLM is fully covered by arrays of micro mirrors with a flat optically reflective layer 102 on the upper surfaces and a pair of torsion hinges 106 under the cavities in the lower portion of mirror plate 103. Pair of torsion hinges 106 in the mirror plate 103 is fabricated to be part of the mirror plate 103 and are kept in a minimum distance under the reflective surface to allow only a gap for a pre-determined angular rotation. By minimizing the distances between a hinge rotating axes 106 to the upper reflective surfaces 102, the spatial light modulator effectively eliminates the horizontal displacement of each mirror during an angular transition. According to the present invention, the gaps between adjacent mirrors in the array of SLM can be reduced to less than 0.2 microns to achieve the highest active reflection area fill-ratio of a micro mirror array at the present time.

The materials used for micro deflection devices are preferably conductive, stable, with suitable hardness, elasticity, and stress. Ideally a single material, such as the electromechanical materials, will cover both the stiffness of mirror plate 103 and plasticity of torsion hinges 106 having sufficient strength to deflect without fracturing. Furthermore, all the materials used in constructing the micro mirror array have to be processed under 400° C., a typical manufacturing process temperature without damaging the pre-fabricated circuitries in the control substrate.

In the implementation shown in FIGS. 1a and 1b, the mirror plate 102 includes three layers. A reflective top layer 103a is made of aluminum and is typically 600 angstrom thick. A middle layer 103b made of a silicon based material, for example, amorphous silicon, and is typically 2000 to 5000 angstrom thick. A bottom layer 103c is made of titanium and is typically 600 angstrom thick. As can be seen from FIGS. 1a and 1b, the hinge 106 can be implemented as part of the bottom layer 103c. The mirror plate 102 can be fabricated as described below.

According to another embodiment of the present invention, the materials of mirror plates 103, torsion hinges 106, and support posts 105 are made of aluminum-silicon based electromechanical materials, such as aluminum, silicon, polysilicon, amorphous silicon, and aluminum-silicon alloys, and their alloys. The deposition is accomplished by PVD magnetron sputtering a single target containing either or both aluminum and silicon in a controlled chamber with temperature bellow 500° C. Same structure layers may also be formed by PECVD.

According to another embodiment of the present invention, the materials of mirror plates 103, torsion hinges 106, and support posts 105 are made of refractory-metals based electromechanical materials, such as titanium, tantalum, tungsten, molybdenum, their silicides, and their alloys. Refractory metal and their silicides are compatible with CMOS semiconductor processing and have relatively good mechanical properties. These materials can be deposited by PVD, by CVD, and by PECVD. The optical reflectivity may be enhanced by further PVD depositing a layer of metallic thin-films 102, such as aluminum, gold, or their alloys depending on the applications on the surfaces of mirror plate 103.

To achieve high contrast ratio of the deflected video images, any scattered light from a micro mirror array should be reduced or eliminated. Most common interferences come from the diffraction patterns generated by the scattering of illumination from the leading and trailing edges of individual mirrors. The solution to the diffraction problem is to weaken the intensity of diffraction pattern and to direct the scattered light from the inactive area of each pixel to different directions away from the projection pupil. One method is directing the incident light 411 45° to the edges of the square shape mirror 102 pixels, which sometimes called diagonal hinge or diagonal illumination configuration. FIG. 2 is a perspective view showing the top of a part of the mirror array with each mirror 102 having a square shape using a diagonal illumination system. The hinges 106 of mirror in the array are fabricated in diagonal direction along two opposite corners of the mirror and in perpendicular to the light of illumination 411. The advantage of a square shape mirror with a diagonal hinge axis is its ability to deflect the scattered light from the leading and trailing edges 45° away from the projection pupil 403. The disadvantage is that it requires the projection prism assembly system to be tilted to the edge of the SLM. The diagonal illumination has a low optical coupling efficiency when a conventional rectangular TIR prism system is used to separate the "on" and "off" light selected by each mirror 102. The twisted focusing spot requires an illumination larger than the size of rectangular micro mirror array surfaces in order to cover all active pixel arrays. A larger rectangular TIR prism increases the cost, size, and the weight of the projection display.

A perspective view of the top of a part of the control circuitry substrate for the projection system with diagonal illumination configuration is shown in FIG. 3. The pair of step electrodes 221 is arranged diagonal accordingly to improve the electrostatic efficiency of the capacitive coupling to the mirror plate 103. The two micro tips 211a and 211b act as the landing stops for a mechanical landing of mirrors 103 to ensure the precision of tilted angle θ and to overcome the contact stictions. Made of high spring constant materials, these micro tips 222a and 222b act as landing springs to reduce the contact area when mirrors are snap down. Second function of these micro tips 222 at the edge of two-level step electrodes 221 is their spring effect to separate itself from the mirror plates 103. When a sharp bipolar pulse voltage potential Vb is applied on the mirror 103 through a common bias 303 of mirror array, a sharp increase of electrostatic forces F on the whole mirror plate 103 provides a dynamic excitation by converting the electromechanical kinetic energy into an elastic strain energy stored in the deformed mirror hinges 106. The elastic strain energy is converted back to the kinetic energy of mirror plate 103 as it springs and bounces away from the landing tip 222.

The periodic array of the straight or corner shape edges of mirror in a SLM creates a diffraction patterns tended to reduce the contrast of projected images by scattering the illumination 411 at a fixed angle. A curvature shape leading and trailing edges of mirror in the array generates much weaker diffraction patterns due to the variation of scattering angles of the illumination 411 on the edges of mirror. According to another embodiment of the present invention, the reduction of the diffraction intensity into the projection pupil 403 while still maintaining an orthogonal illumination optics system is achieved by replacing the straight or fixed angular corner shape edges of a rectangular shape mirror with at least one or a series curvature shape leading and trailing edges with opposite recesses and extensions. Forming a curvature in the leading and trailing edges that is in perpendicular to the incident illumination 411 weakens the diffraction intensity and reduces a large portion of scattering light diffracted directly into the projection system.

Orthogonal illumination has a higher optical system coupling efficiency, and requires a less expensive, smaller size, and lighter TIR prism. However, since the scattered light from both leading and trailing edges of mirror is scattered straightly into the projection pupil 403, it creates a diffraction patterns reducing the contrast ratio of a SLM. FIG. 4 shows a perspective view of the top of a part of mirror array with rectangular shape mirrors for the projection system with orthogonal illumination configuration. The torsion hinges 106 are in parallel to the leading and trailing edges of mirror and in perpendicular to the light of illumination 411. So the mirror pixels in the SLM are illuminated orthogonally. In FIG. 4, each mirror in the array has a series of curvatures in the leading edge extension and trailing edge recession. The principle is that a curvature edge weakens the diffraction intensity of scattered light and it further diffracts a large portion of scattered light at a variation of angles away from the optical projection pupil 403. The radius curvature of leading and trailing edges of each mirror r may vary depending on the numbers of curvatures selected. As the radius of curvature r becomes smaller, the diffraction reduction effect becomes more prominent. To maximize the diffraction reduction effects, according to another embodiment of the present invention, a series of small radius curvatures r are designed to form the leading and trailing edges of each mirror in the array. The number of curvatures may vary depending on the size of mirror pixels, with a 10 microns size square mirror pixel, two to four curvatures on each leading and trailing edges provides an optimum results an low diffraction and within current manufacturing capability.

FIG. 5 is a perspective view showing the top of a part of the control circuitry substrate 300 for a projection system with orthogonal illumination 411 configurations. Unlike conventional flat electrodes, the two-level step electrodes 221 raised above the surface of control substrate 300 near the hinge axis narrows the effective air gap spacing between the flat mirror plate 103 and the bottom electrodes 221, which significantly enhancing the electrostatic efficiency of capacitive coupling of mirror plate 103. The number of levels for the step electrodes 221 can be varying from one to ten. However, the larger the number of levels for step electrodes 221 the more complicated and costly it takes to manufacture the devices. A more practical number would be from two to three. FIG. 5 also shows the mechanical landing stops made of micro tips 222 oriented in perpendicular to the surface of control substrate 300. These tips 222 provide a mechanical stop during the landing operation of angular cross over transitions. The micro tips 222 at the edge of step electrodes 221 act as landing tips to further overcome the contact surface adhesion. This low voltage driven and high efficiency micro mirror array design allows an operation of a larger total deflection angle (|θ|>15°) of micro mirrors to enhance the brightness and contrast ratio of the SLM.

Another advantage of this reflective spatial light modulator is that it produces the highest possible active reflection area fill-ratio by positioning the torsion hinge 106 under the cavities in the lower portion of mirror plate 103, which almost completely eliminates the horizontal displacement of mirror 103 during an angular cross over transition. An enlarged backside view of a part of the mirror array designed to reduce diffraction intensity using four-curvature leading and trailing edges is shown in FIG. 6 for a projection system with orthogonal illumination 411 configuration. Again, pairs of torsion hinges 106 are positioned under two cavities as part of the mirror lower portion 103 and supported by a pair of support posts 105 on top of support frames 202. A pair of hinge support post 105 has a width Win the cross section much larger than the width of torsion hinge bar 106. Since the distance between the axis of hinge 106 to the reflective surfaces of mirror is kept minimum, a high active reflection area fill-ratio is achieved by closely packed individual mirror pixels without worrying the horizontal displacement. In one of the present invention, mirror pixel size (a×b) is about 10 microns×10 microns, while the radius of curvature r is about 2.5 microns.

FIG. 7 is an enlarged backside view of a part of the mirror plate showing the torsion hinges 106 and their support posts 105 under the cavities in the lower portion of a mirror plate 103. To achieve optimum performance, it is important to maintain a minimum air gap G in the cavity where the torsion hinges 106 are created. The dimension of hinges 106 varies depending on the size of the mirrors 102. At present invention, the dimension of each torsion hinge 106 is about 0.1×0.2×3.5 microns, while the support post 105 has a square shape cross section with each side W about 1.0 micron width. Since the top surfaces of support posts 105 are also under the cavities as lower part of the mirror plate 103, the air gap G in the cavity needs to be high enough to accommodate the angular rotation of mirror plate 103 without touching the larger hinge support posts 105 at a predetermined angle θ. In order for the mirror to rotate a pre-determined angle θ without touching the hinge support post 105, the air gap of the cavities where torsion hinges 106 are positioned must be larger than G=0.5×W×SIN (θ), where W is the cross section width of hinge support posts 105.

FIG. 8 is a diagram illustrates a minimum air gap spacing G around the torsion hinge 106 of a mirror plate 103 when rotated 15° in one direction. The calculation indicates the air gap spacing G of torsion hinge 106 in the cavity must be larger than G=0.13 W. If width of each side W of a square shape hinge support post 105 is 1.0 micron, the air gap spacing G in the cavity should be larger than 0.13 microns. Without horizontal displacement during the angular transition operation, the horizontal gap between the individual mirrors in the micro mirror array may be reduced to less than 0.2 microns, which led to a 96% active reflection area fill-ratio of the SLM according to the present invention.

According to another embodiment of the present invention, fabrication of a high contrast spatial light modulator is divided into four sequential sections using standard CMOS technology. First is forming a control silicon wafer substrate with support frames and arrays of first level electrodes on the surfaces and connected to the memory cells in the addressing circuitry in the wafer, resembling a low-density memory array. Second is forming a plurality of second level electrodes, micro landing tips, and hinge support posts on the surfaces of control substrate. Third is forming a plurality of mirrors with hidden hinges on each pairs of support posts. At last, the fabricated wafer is separated into individual spatial light modulation device dies before finally removing the remaining sacrificial materials.

One preferred embodiments of the manufacturing process flow diagram for a high contrast spatial light modulator is shown in FIG. 9. The manufacturing processes starts by fabricating a CMOS circuitry wafer having a plurality of memory cells and word-line/bit-line interconnection structures for communicating signals as the control substrate using common semiconductor technology 810. A plurality of first level electrodes and support frames are formed by patterning a plurality of via through the passivation layer of circuitry opening up the addressing nodes in the control substrate 820. To enhance the adhesion for subsequent electromechanical layer, the via and contact openings are exposed to a 2000 watts of RF or microwave plasma with 2 torr total pressures of a mixture of O2, CF4, and H2O gases at a ratio of 40:1:5 at about 250° C. temperatures for less than five minutes. An electromechanical layer is deposited by physical vapor deposition (PVD) or plasma-enhanced chemical vapor deposition (PECVD) depending on the materials selected filling via and forming an electrode layer on the surface of control substrate 821. Then the electromechanical layer is patterned and etched anisotropically through to form a plurality of electrodes and support frames 822. The partially fabricated wafer is tested 823 to ensure the electrical functionality before proceeding to further processes.

According to one preferred embodiment of the present invention, the electromechanical layer is aluminum metallization, which can take the form of a pure Al, titanium, tantalum, tungsten, molybdenum film, an Al/poly-Si composite, an Al—Cu alloy, or an Al—Si alloy. While each of these metallization has slightly different etching characteristics, they all can be etched in similar chemistry in plasma etching of Al. In present invention, a two step processes is carried out to etch aluminum metallization layers anisotropically. First, the wafer is etched in inductive coupled plasma while flowing with BCl3, Cl2, and Ar mixtures at flow rates of 100 sccm, 20 sccm, and 20 sccm respectively. The operating pressure is in the range of 10 to 50 mTorr, the inductive coupled plasma bias power is 300 watts, and the source power is 1000 watts. During the etching process, wafer is cooled with a backside helium gas flow of 20 sccm at a pressure of 1 Torr. Since the Al pattern can not simply be removed from the etching chamber into ambient atmosphere, a second oxygen plasma treatment step must be performed to clean and passivate Al surfaces. In a passivation process, the surfaces of partially fabricated wafer is exposed to a 2000 watts of RF or microwave plasma with 2 torr pressures of a 3000 sccm of H2O vapor at about 250° C. temperatures for less than three minutes.

According to another embodiment of the present invention, the electromechanical layer is silicon metallization, which can take the form of a polysilicon, a polycides, or a silicide. While each of these electromechanical layers has slightly different etching characteristics, they all can be etched in similar chemistry in plasma etching of polysilicon. Anisotropic etching of polysilicon can be accomplished with most Cl and F based feedstock, such as Cl2, BCl3, CF4, NF3, SF6, HBr, and their mixtures with Ar, N2, O2, and H2. In present invention, the poly silicon or silicide layer (WSix, or TiSix, or TaSi) is etched anisotropically in inductive decoupled plasma while flowing with Cl2, BCl3, HBr, and HeO2 gases at flow rates of 100 sccm, 50 sccm, 20 sccm, and 10 sccm respectively. In another embodiment, the polycide layer is etched anisotropically in a reactive ion etch chamber flowing with Cl2, SF6, HBr, and HeO2 gases at a flow rate of 50 sccm, 40 sccm, 40 sccm, and 10 sccm respectively. In both cases, the operating pressure is in the range of 10 to 30 mTorr, the inductive coupled plasma bias power is 100 watts, and the source power is 1200 watts. During the etching process, wafer is cooled with a backside helium gas flow of 20 sccm at a pressure of 1 Torr. A typical etch rate can reach 9000 angstroms per minute.

In order to improve the electrostatic efficiency and reduce the stiction during the angular cross over transition of the micro mirror arrays, a plurality of second level electrodes and micro landing tips are fabricated on the surfaces of control substrate. First, a layer of sacrificial materials is deposited with a predetermined thickness on the surface of partially fabricated wafer 830. If the sacrificial material is photoresist, the layer is spin coated on the surface. If it is organic polymer, the layer is deposited by PECVD. To prepare for the subsequent build up, the sacrificial layer has to be hardened by exposing the layer to ultraviolet light, then exposing to a CF4 plasma for about three minutes, then baking the layer at about 150° C. for about two hours, finally exposing the layer to oxygen plasma for about one minute. Second, the sacrificial layer is patterned forming via and contact openings for a plurality of second level electrodes, landing tips, and support posts 831. Third, a second electromechanical layer is deposited by PVD or PECVD depending on the materials selected forming a plurality of second level electrodes, landing tips, and support posts 832. Finally, the second electromechanical layer is planarized to a predetermined thickness by chemical mechanical polishing (CMP) 833. A preferred height of second level electrodes and micro landing tips is less than one micron.

Once the raised multi-level step electrodes and micro landing tips are formed on the CMOS control circuitry substrate, a plurality of mirrors with hidden hinges on each pairs of support posts are fabricated. The processes started with depositing sacrificial materials with a predetermined thickness on the surface of partially fabricated wafer 840. Then sacrificial layer is patterned to form via for a plurality of hinge support posts 841. The sacrificial layer is further hardened before a deposition of electromechanical materials by PVD or PECVD depending on materials selected to fill via and form a thin layer for torsion hinges and part of mirrors 842. The electromechanical layer planarized to a predetermined thickness by CMP 843. The electromechanical layer is patterned a plurality of openings to form a plurality of torsion hinges 850. To form a plurality of cavities in the lower portion of mirror plate and torsion hinges positioned under the cavity, sacrificial materials is again deposited to fill the opening gaps around the torsion hinges and to form a thin layer with a predetermined thickness on top of hinges 851. A preferred thickness is slightly larger than $G=0.5 \times W \times SIN(\theta)$, where W is the cross section width of hinge support posts 105. The sacrificial layer patterned to form a plurality of spacers on top of each torsion hinge 852. More electromechanical materials are deposited to cover the surface of partially fabricated wafer 853. The electromechanical layer is planarized to a predetermined thickness by CMP 854 before patterned a plurality of openings to form a plurality of air gaps between individual mirror plates 870. The reflectivity of mirror surface may be enhanced by a PVD deposition of 400 angstroms or less thickness reflective layer selected from the group consisting of aluminum, gold, and combinations thereof 860.

To separate the fabricated wafer into individual spatial light modulation device dies, a thick layer of sacrificial materials is deposited to cover the fabricated wafer surfaces for protection 880. Then the fabricated wafer is partially sawed 881 before separating into individual dies by scribing and breaking 882. The spatial light modulator device die is attached to the chip base with wire bonds and interconnects 883 before a RF or microwave plasma striping of the remaining sacrificial materials 884. The SLM device die is further lubricated by exposing to a PECVD coating of lubricants in the interfaces between the mirror plate and the surface of electrodes and landing tips 885 before electro-optical functional test 886. Finally, the SLM device is hermetically sealed with a glass window lip 887 and sent to burn-in process for reliability and robust quality control 888.

One of the major problems in the digital operation of micro mirror array is the high stiction of micro mirror at a mechanical landing position. The surface contact adhesion could increases beyond the electrostatic force of control circuitry causing the device from stiction failure in a moisture environment. To reduce the contact adhesion between the mirror plate 103 and landing tips 222, and protect the mechanical wear degradation of interfaces during the touch and impact of angular cross over transition, a thin lubricated coating is deposited on the lower portion of mirror plate 103 and on the surface of electrodes 221 and landing tips 222. The lubricants chosen should be thermally stable, low vapor pressure, and non-reactive with metallization and electromechanical materials that formed the micro mirror array devices.

In the embodiment of the presentation invention, fluorocarbon thin film is coated to the surfaces of the lower portion of mirror plate and on the surface of electrodes and landing tips. The SLM device die is exposed to plasma of fluorocarbons, such as CF4, at a substrate temperature of about 200° C. temperatures for less than five minutes. The fluorine on the surfaces 103 serves to prevent adherence or attachment of water to the interfaces of mirror plate and the underneath electrodes and landing tips, which eliminates the impact of humidity in the stiction of mirror during landing operation. Coating fluorocarbon film in the interfaces between the mirror plate 103 and underneath electrodes 221 and landing tips 222 provides a sufficient repellent performance to water due to the fluorine atoms existing near the exposed surfaces.

In another embodiment of present invention, a perfluoropolyether (PFPE) or a mixture of PFPE or a phosphazine derivative is deposited by PECVD in the interfaces between the mirror plate 103 and underneath electrodes 221 and landing tips 222 at a substrate temperature of about 200° C. temperatures for less than five minutes. PFPE molecules have an aggregate vapor pressure in the range of $1 \times 10^{-6}$ to $1 \times 10^{-11}$ atm. The thickness of lubricant film is less than 1000 angstroms. To improve the adhesion and lubricating performance on the surface of a metallization or an electromechanical layer, phosphate esters may be chosen because of its affinity with the metallic surface.

Figure 18:
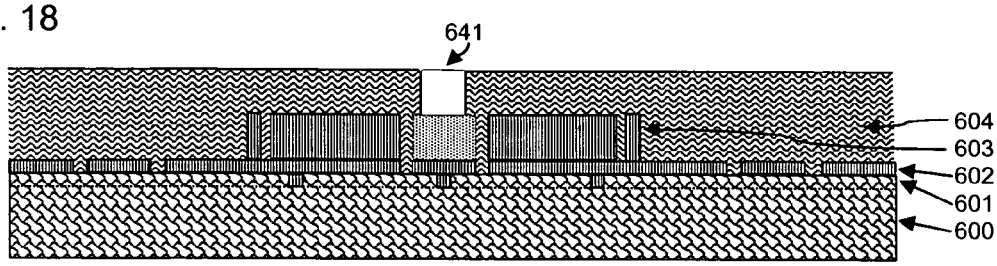
FIG. 18-20 are cross section side views of a part of a spatial light modulator illustrating one method for fabricating a plurality of torsion hinges and its supports on the support frame.
Figure 19:
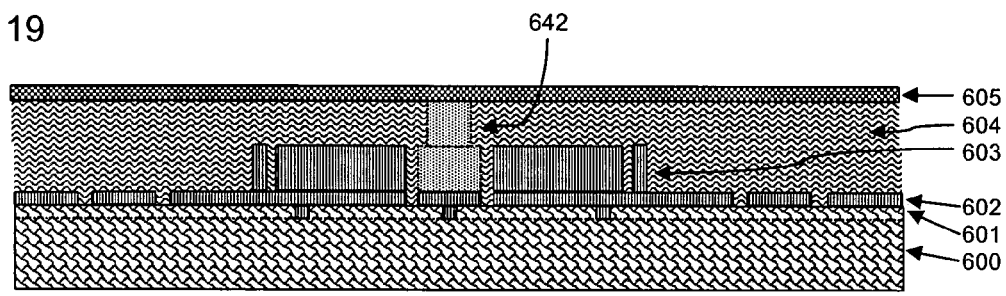
Figure 20:
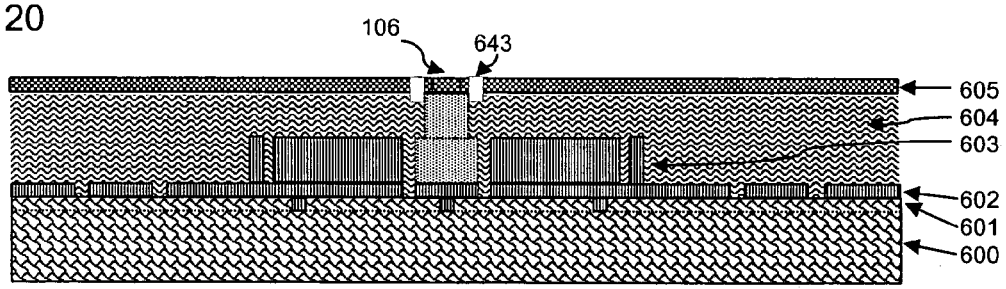
Figure 21:
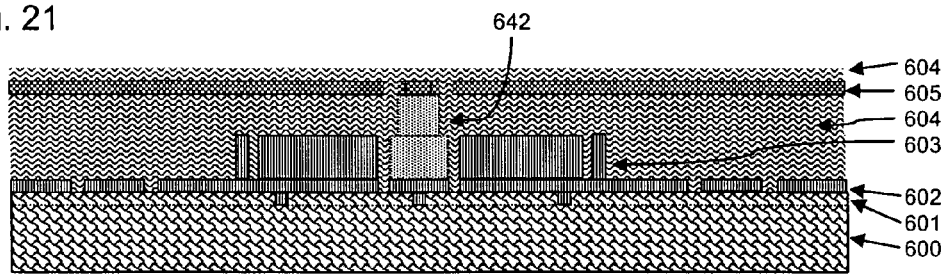
FIG. 21-23 are cross section side views of a part of a spatial light modulator illustrating one method for fabricating a mirror plate with a plurality of hidden hinges.
Figure 22:
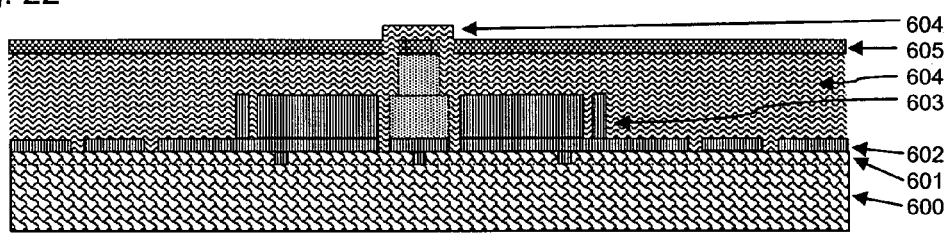
Figure 23:
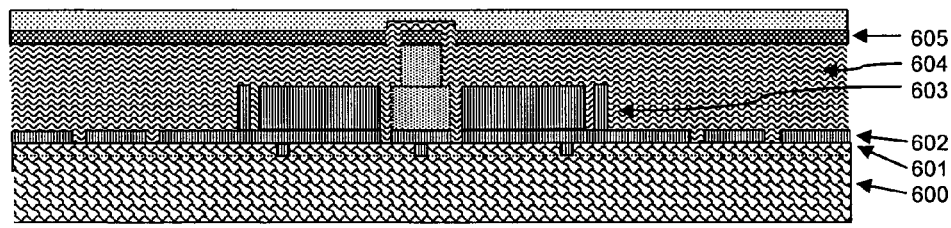

More detail description of each process to fabricate a high contrast spatial light modulator is illustrated in a series of cross section diagrams. FIG. 10 to FIG. 13 are cross section side views of a part of a spatial light modulator illustrating one method for fabricating a plurality of support frames and the first level electrodes connected to the memory cells in the addressing circuitry. FIG. 14 to FIG. 17 are cross section side views of a part of a spatial light modulator illustrating one method for fabricating a plurality of support posts, second level electrodes, and landing tips on the surface of control substrate. FIG. 18 to FIG. 20 are cross section side views of a part of a spatial light modulator illustrating one method for fabricating a plurality of torsion hinges and its supports on the support frame. FIG. 21 to FIG. 23 are cross section side views of a part of a spatial light modulator illustrating one method for fabricating a mirror plate with a plurality of hidden hinges. FIG. 23 to FIG. 26 are cross section side views of a part of a spatial light modulator illustrating one method for forming the reflective mirrors and releasing individual mirrors of a micro mirror array.

FIG. 10 is a cross sectional view that illustrates the control silicon wafer substrate 600 after using standard CMOS fabrication technology. In one embodiment, the control circuitry in the control substrate includes an array of memory cells, and word-line/bit-line interconnects for communication signals. There are many different methods to make electrical circuitry that performs the addressing function. The DRAM, SRAM, and latch devices commonly known may all perform the addressing function. Since the mirror plate 102 area may be relatively large on semiconductor scales (for example, the mirror plate 102 may have an area of larger then 100 square microns), complex circuitry can be manufactured beneath micro mirror 102. Possible circuitry includes, but is not limited to, storage buffers to store time sequential pixel information, and circuitry to perform pulse width modulation conversions.

In a typical CMOS fabrication process, the control silicon wafer substrate is covered with a passivation layer 601 such as silicon oxide or silicon nitride. The passivated control substrate 600 is patterned and etched anisotropically to form via 621 connected to the word-line/bit-line interconnects in the addressing circuitry, shown in FIG. 11. According to another embodiment of the present invention, anisotropic etching of dielectric materials, such silicon oxides or silicon nitrides, is accomplished with C2F6 and CHF3 based feedstock and their mixtures with He and O2. One preferred high selectivity dielectric etching process flows C2F6, CHF3, He, and O2 at a ratio of 10:10:5:2 mixtures at a total pressure of 100 mTorr with inductive source power of 1200 watts and a bias power 600 watts. The wafers are then cooled with a backside helium gas flow of 20 sccm at a pressure of 2 torr. A typical silicon oxides etch rate can reach 8000 angstroms per minute.

Figure 12:
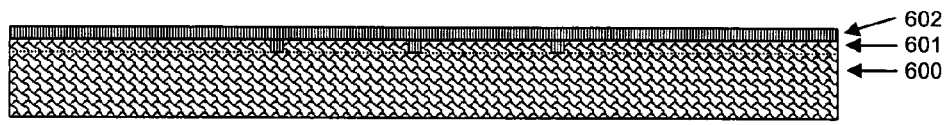
Figure 13:
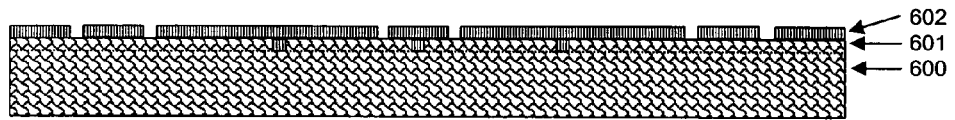
Figure 14:
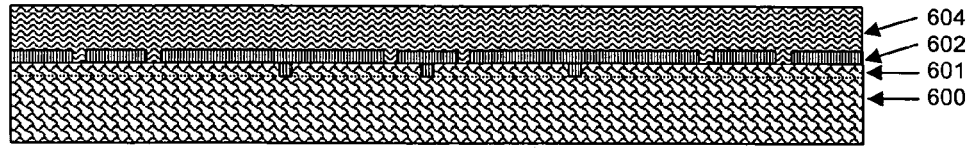
FIG. 14-17 are cross section side views of a part of a spatial light modulator illustrating one method for fabricating a plurality of support posts, second level electrodes, and landing tips on the surface of control substrate.

Next, FIG. 12 shows that an electromechanical layer 602 is deposited by PVD or PECVD depending on the electromechanical materials selected. This electromechanical layer 602 is patterned to define hinge support frames 202 and the first level electrodes 221 corresponding to each micro mirror 102, shown in FIG. 12. The patterning electromechanical layer 602 is performed by the following processes. First, a layer of photoresist is spin coated to cover the substrate surface. Then photoresist layer is exposed to standard photolithography and developed to form predetermined patterns. The electromechanical layer is etched anisotropically through to form a plurality of via and openings. Once via and openings are formed, the partially fabricated wafer is cleaned by removing the residues from the surfaces and inside the openings. This is accomplished by exposing the patterned wafer to a 2000 watts of RF or microwave plasma with 2 torr total pressures of a mixture of O2, CF4, and H2O gases at a ratio of 40:1:5 at about 250° C. temperatures for less than five minutes. Finally, the surfaces of electromechanical layer is passivated by exposing to a 2000 watts of RF or microwave plasma with 2 torr pressures of a 3000 sccm of H2O vapor at about 250° C. temperatures for less than three minutes.

Next step is forming a plurality of second level electrodes 221, micro landing tips 222, and support pots 105 on the surface of partially fabricated wafer. A micron thick sacrificial material 604 is deposited on the substrate surface, which can be spin coated photoresist or PECVD of organic polymers, shown in FIG. 13. The sacrificial layer 604 is hardened by a series thermal and plasma treatments to transform structure of materials from a hydrophobic state to hydrophilic state of polymers. First, the sacrificial layer 604 is exposed to ultraviolet light, then to a CF4 plasma for about three minutes, followed by baking sacrificial layer at about 150° C. for about two hours before exposing sacrificial layer to oxygen plasma for about one minute. In some case, implanting the sacrificial layer with KeV energy of silicon, boron, or phosphors ions further hardens the sacrificial layers 604.

Figure 15:
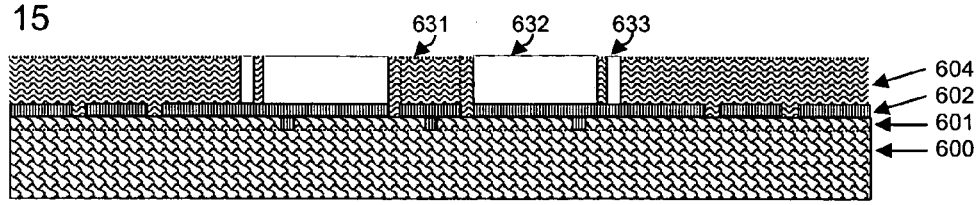
Figure 16:
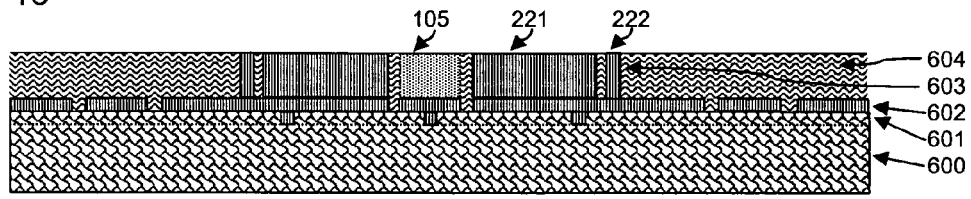

Then, sacrificial layer 604 is patterned to form a plurality of via and contact openings for second level electrodes 632, micro landing tips 633, and support pots 631 as shown in FIG. 15. To enhance the adhesion for subsequent electromechanical layer, the via and contact openings are exposed to a 2000 watts of RF or microwave plasma with 2 torr total pressures of a mixture of O2, CF4, and H2O gases at a ratio of 40:1:5 at about 250° C. temperatures for less than five minutes. Electromechanical material 603 is then deposited to fill via and contact openings. The filling is done by either PECVD or PVD depending on the materials selected. For the materials selected from the group consisting of aluminum, titanium, tungsten, molybdenum, their alloys, PVD is a common deposition method in the semiconductor industry. For the materials selected from the group consisting of silicon, polysilicon, silicide, polycide, tungsten, their combinations, PECVD is chosen as a method of deposition. The partially fabricated wafer is further planarized by CMP to a predetermined thickness slightly less than one micron shown in FIG. 16.

Figure 17:
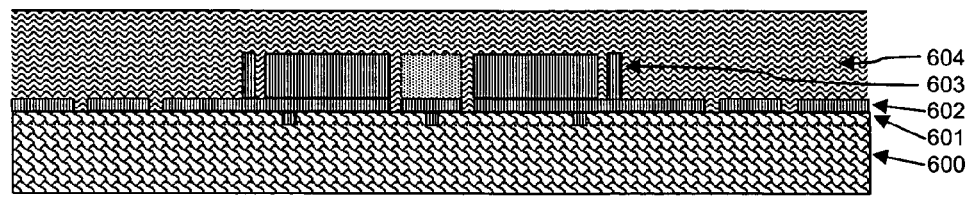

After the CMP planarization, FIG. 17 shows that another layer of sacrificial materials 604 is spin coated on the blanket surface to a predetermined thickness and hardened to form the air gap spacer under the torsion hinges. The sacrificial layer 604 is patterned to form a plurality of via or contact openings for hinge support posts 641 as shown in FIG. 18. In FIG. 19, electromechanical material is deposited to fill via and form a torsion hinge layer 605 on the surface. This hinge layer 605 is then planarized by CMP to a predetermined thickness. The thickness of electromechanical layer 605 formed here defines the thickness of torsion hinge bar and the mechanical performance of mirror later on.

The partially fabricated wafer is patterned and etched anisotropically to form a plurality of torsion hinges 106 in the electromechanical layers 605 as shown in FIG. 20. More sacrificial materials 604 is deposited to fill the openings 643 surrounding each hinges and to form a thin layer 604 with predetermined thickness on the surface, as shown in FIG. 21. The thickness of this layer 604 defines the height of the spacers on top of each torsion hinges 106. The sacrificial layer 604 is then patterned to form a plurality of spacers on top of each torsion hinges 106, as shown in FIG. 22. Since the top surfaces of support posts 642 are also under the cavities as lower part of the mirror plate 103, the air gap G in the cavity needs to be high enough to accommodate the angular rotation of mirror plate 103 without touching the larger hinge support posts 105 at a pre-determined angle $\theta$. In order for the mirror to rotate a pre-determined angle $\theta$ without touching the hinge support post 105, the air gap of the cavities where torsion hinges 106 are positioned must be larger than $G=0.5 \times W \times SIN(\theta)$, where W is the cross section width of hinge support posts 105. In the present invention, each mirror in the array may rotate 15° in each direction. The calculation indicates the air gap spacing G of torsion hinge 106 in the cavity must be larger than $G=0.13W$. If width of each side W of a square shape hinge support post 105 is 1.0 micron, the air gap spacing G in the cavity should be larger than 0.13 microns.

Figure 24:
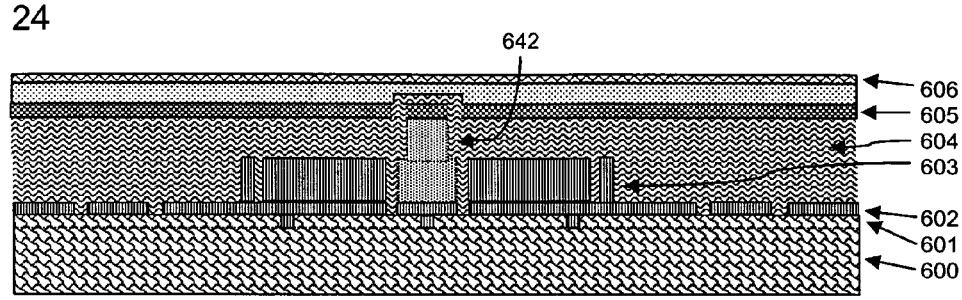
FIG. 24-26 are cross section side views of a part of a spatial light modulator illustrating one method for forming the reflective mirrors and releasing individual mirrors of a micro mirror array.
Figure 25:
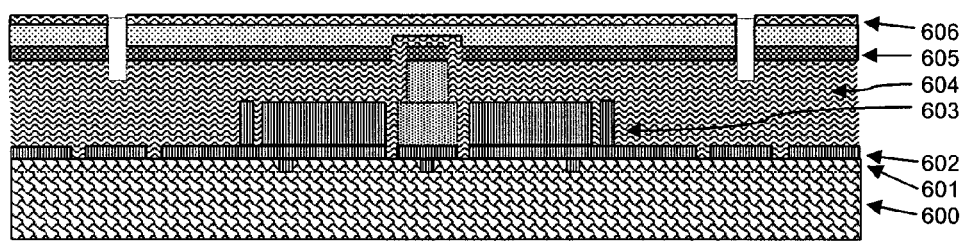

To form a mirror with torsion hinges 106 under each cavities in the lower portion of mirror plate 103, more electromechanical materials 605 is deposited to cover a plurality of sacrificial spacers, as shown in FIG. 23. In some cases, a chemical-mechanical-polished (CMP) process is added to ensure a flat reflective surface of electromechanical layer 605 has been achieved before etching to form individual mirrors. The thickness of the total electromechanical layer 605 will ultimately be the approximate thickness of the mirror plate 103 eventually fabricated. In FIG. 23, surface of partially fabricated wafer is planarized by CMP to a predetermined thickness of mirror plate 103. In present invention, the thickness of mirror plate 605 is between 0.3 microns to 0.5 microns. If the electromechanical material is aluminum or its metallic alloy, the reflectivity of mirror is high enough for most of display applications. For some other electromechanical materials or for other applications, reflectivity of mirror surface may be enhanced by deposition of a reflective layer 606 of 400 angstroms or less thickness selected from the group consisting of aluminum, gold, their alloys, and combinations, as shown in FIG. 24. The reflective surface 606 of electromechanical layer is then patterned and etched anisotropically through to form a plurality of individual mirrors, as shown in FIG. 25.

Figure 26:
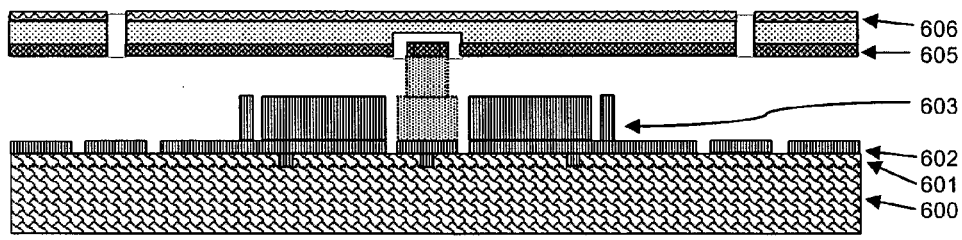

FIG. 26 shows the remaining sacrificial materials 604 are removed and residues are cleaned through a plurality of air gaps between each individual mirrors in the array to form a functional micro mirror array based spatial light modulator. In a real manufacturing environment, more processes are required before delivering a functional spatial light modulator for video display application. After reflective surface 606 of electromechanical layer 605 is patterned and etched anisotropically through to form a plurality of individual mirrors, more sacrificial materials 604 are deposited to cover the surface of fabricated wafer. With its surface protected by a layer of sacrificial layer 604, fabricated wafer is going through common semiconductor packaging processes to form individual device dies. In a packaging process, fabricated wafer is partially sawed 881 before separating into individual dies by scribing and breaking 882. The spatial light modulator device die is attached to the chip base with wire bonds and interconnects 883 before striping the remaining sacrificial materials 604 and its residues in the structures 884. The cleaning is accomplished by exposing the patterned wafer to a 2000 watts of RF or microwave plasma with 2 torr total pressures of a mixture of O2, CF4, and H2O gases at a ratio of 40:1:5 at about 250° C. temperatures for less than five minutes. Finally, the surfaces of electromechanical and metallization structures are passivated by exposing to a 2000 watts of RF or microwave plasma with 2 torr pressures of a 3000 sccm of H2O vapor at about 250° C. temperatures for less than three minutes.

The SLM device die is further coated an anti-stiction layer inside the opening structures by exposing to a PECVD of fluorocarbon at about 200° C. temperatures for less than five minutes 885 before plasma cleaning and electro-optical functional test 886. Finally, the SLM device is hermetically sealed with a glass window lip 887 and sent to burn-in process for reliability and robust quality control 888.

Although the invention has been particularly shown and described with reference to multiple embodiments, it will be understood by persons skilled in the relevant art that various changes in form and details can be made therein without departing from the spirit and scope of the invention. For example, the same 3-dimensional multi-layer structures may be constructed by patterning and etching the electromechanical layers, rather than patterning the sacrificial layers and etching via.

Figure 27:
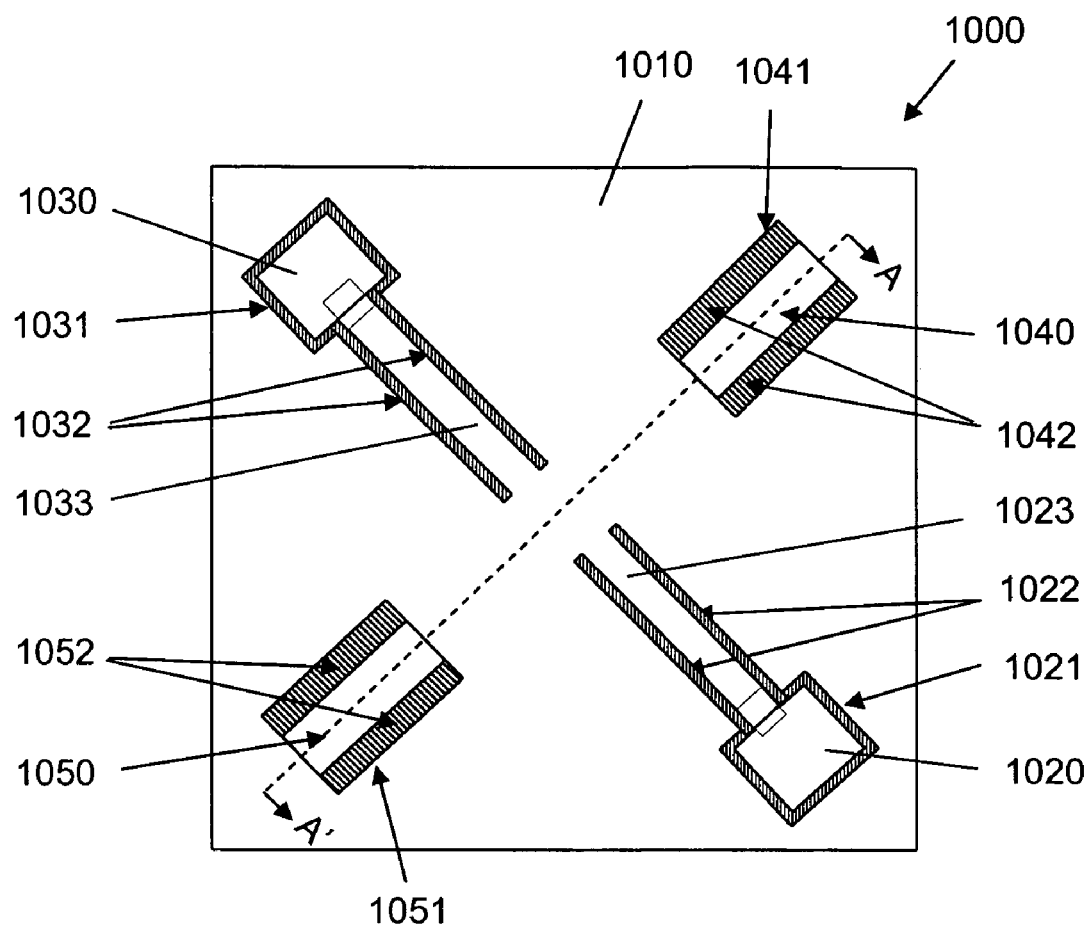
FIG. 27 is a bottom view of the micro-mirror plate having anti-stiction features.
Figure 28:
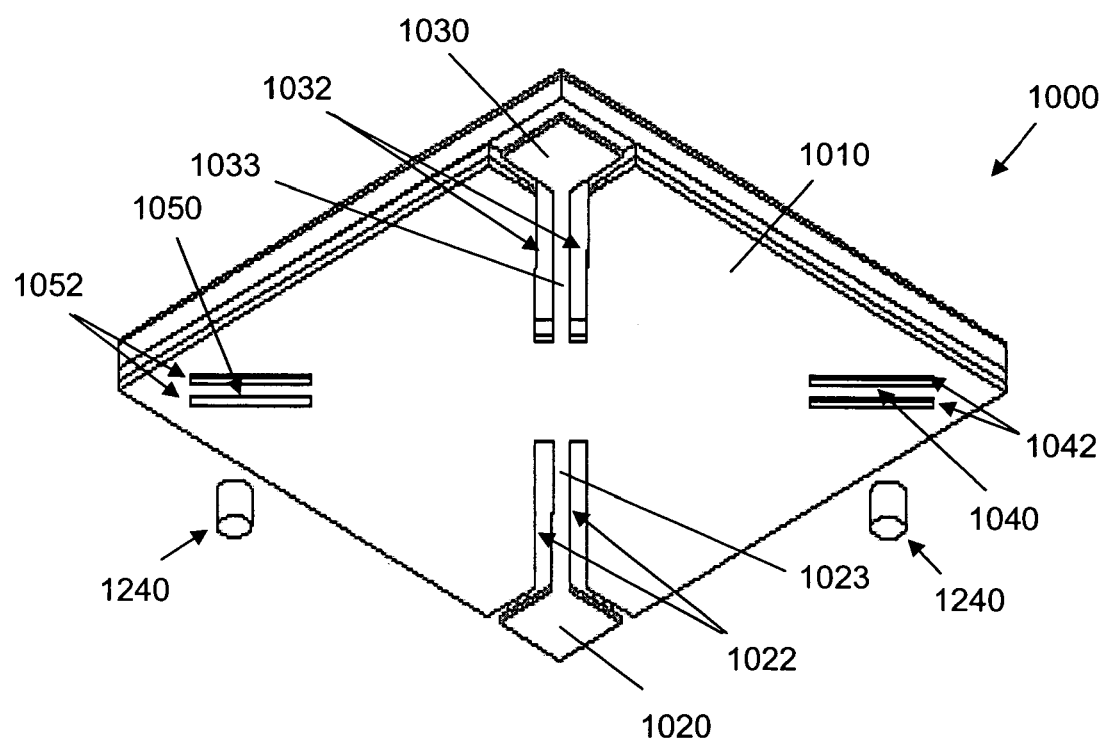
FIG. 28 is a lower perspective view of the micro-mirror plate.
Figure 29:
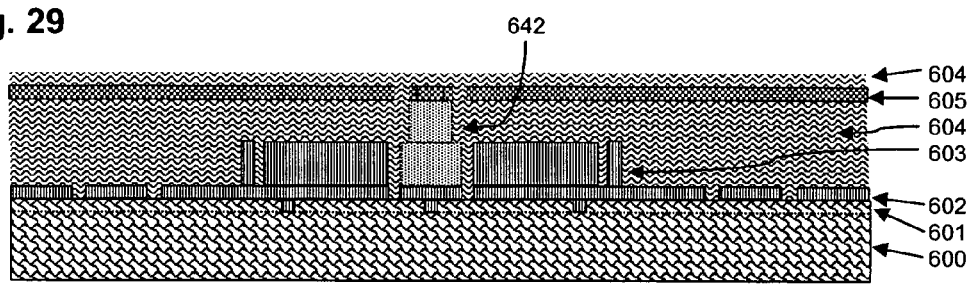
FIG. 29-31 are cross section side views of a part of a spatial light modulator illustrating a process for fabricating a mirror plate having one or more of hidden hinges and a second cavity partially covered by a membrane.

FIG. 27 is a bottom view of the micro-mirror plate 1000 having anti-stiction features across the lower surface 1010. FIG. 28 is a lower perspective view of the micro-mirror plate. At least a portion of the lower surface 1010 is conductive. The conductive surface is connected to an electric circuit such that a voltage can be applied across the lower surface 1010 and an electrode over the control substrate. A pair of cavities 1021 and 1031 are fabricated in the underside of the micro-mirror plate 1000. A pair of torsional hinges 1020 and 1030 respectively extend into the cavities 1020 and 1030. The torsional hinges 1020 and 1030 are respectively connected to the main body of the micro-mirror plate 1000 through the hinges 1023 and 1033 and the hinge support posts 1025 and 1035 are connected to the control substrate (1150).

The torsional hinge 1020 is separated from the walls of the cavity 1021 by air gaps to allow the rotation or tilt of the mirror plate 1000 relative to the torsional hinge 1020. The elongated hinge bridge 1023 is connected with the torsional hinge 1021 at one end and the main body of the micro-mirror plate 1000 at the other. The side surfaces of the hinge bridge 1023 are separated from the main body of the micro-mirror plate 1000 by channels 1022 and an air gap over the top surface of the hinge bridge 1023. Similarly, the torsional hinge 1030 is separated from the walls of the cavity 1031 by air gaps. The elongated hinge bridge 1033 is connected with the torsional hinge 1031 at one end and the main body of the micro-mirror plate 1000 at the other. The side surfaces of the hinge bridge 1033 are separated from the main body of the micro-mirror plate 1000 by channels 1032 and an air gap over the top surface of the hinge bridge 1033.

As depicted in FIG. 28, the torsional hinges 1020 and 1030 are connected to hinge support posts fixed to the control substrate. When a torque is applied to the micro-mirror plate 1000 by electrostatic forces produced by a voltage across the an electrode over the control substrate and the conductive lower surface 1010 of the mirror plate 1000, as discussed previously, the micro-mirror plate 1000 can tilt around the diagonal axis defined by the two torsional hinges 1020 and 1030, which produces torsional distortions in the elongated hinge bridges 1023 and 1033. The micro-mirror plate can be held at the two angular positions against the micro tips 211a and 211b fixed to the control substrate by the electrically induced torques, as shown in FIGS. 1a and 1b. The incident light waves can thus be reflected by the reflective top surface of the micro-mirror 1000 in two or more directions.

A challenge to the SLM devices is to overcome contact stiction of the micro-mirror plate to the stop positions to allow fast response time in the SLM devices. The contact stiction between the lower surface of the micro-mirror plate to the tip of the landing tips 1240 can slow down or prevent the micro-mirror plate from returning to its original angular positions after the driving electric forces is removed or reversed. The contact stiction can be caused by Van der Waals force and capillary action force produced by the moisture trapped between the contacting surfaces.

To address the contact stiction problem, the micro-mirror plate 1000 includes two additional cavities 1041 and 1051. The cavity 1041 can be partially covered by a membrane 1040 leaving one or more openings 1042. Similarly, a membrane 1050 bridges over the cavity 1051. The membrane 1050 partially covers the cavity 1051 leaving one or more openings 1052. The membranes 1040 and 1050 are positioned such that one of the landing tips 1240 will contact one of the membranes 1040 and 1050 when the micro-mirror plate 1000 rotates.

The cavities 1041 and 1051 and the membranes 1040 and 1050 can be formed by the same processing steps as the cavities 1021 and 1031 and the torsional hinges 1021 and 1031. The cavities 1041 and 1051 can be formed by removing sacrificial materials that leaves air gaps inside the membranes 1040 and 1050. The membranes 1040 and 1050 can be formed by a layer comprising titanium, tantalum, tungsten, molybdenum, or an alloy of these materials. The membranes 1040 and 1050 can also be made of silicon, amorphous silicon, polysilicon, or silicon nitride. In one embodiment, the membranes 1040 and 1050 can comprise substantially the same material compositions as the main body of the micro-mirror plate 1000.

The cavities 1041 and 1051 can be formed by removing a layer of sacrificial material through the openings 1042 and 1052 by the membranes 1040 and 1050. The sacrificial material, for example, can be a layer of photoresist material. In one embodiment, the layer of sacrificial material is patterned and deposited as the same layer as the sacrificial layer for forming the cavities 1021 and 1031 as previously described. The membranes 1040 and 1050 can be formed from the same layer of deposit material as the torsional hinges 1021 and 1031. The simultaneous formation of the anti-sticking features and the torsional hinges has the advantages of reducing manufacturing complexity and production cost, and increasing throughput.

Figure 30:
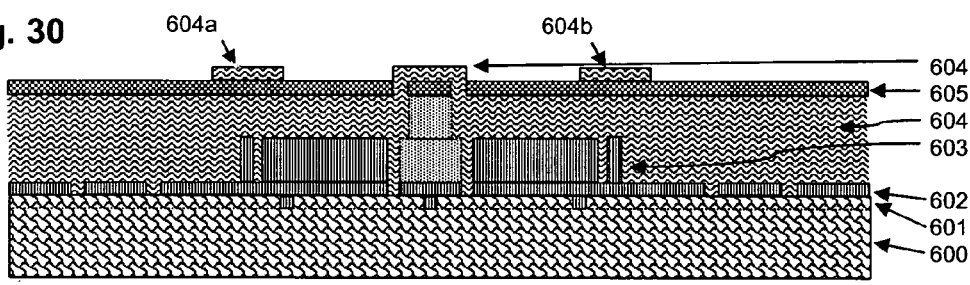
Figure 31:
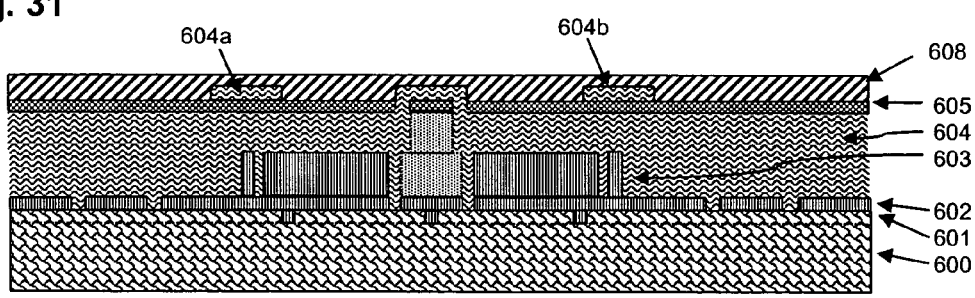
Figure 32:
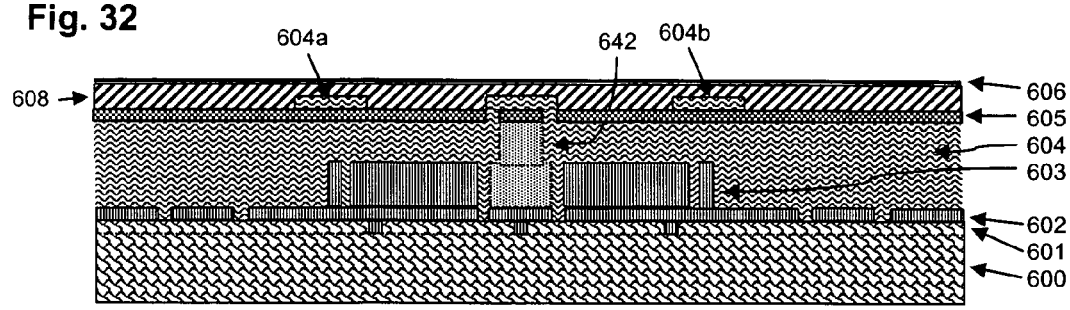
FIG. 32-34 are cross section side views of a part of a spatial light modulator illustrating a process for forming the reflective mirrors and releasing a mirror plate having one or more of hidden hinges and a second cavity partially covered by a membrane.
Figure 33:
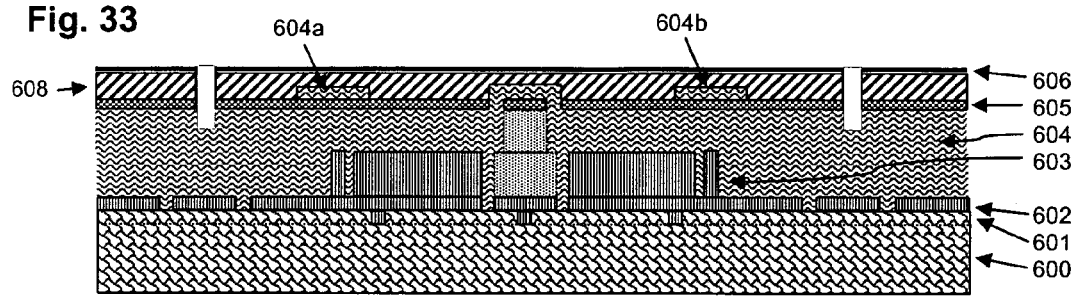
Figure 34:
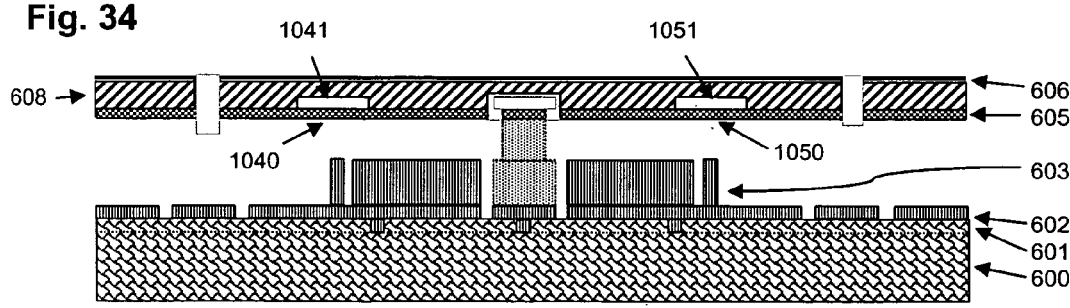

FIG. 29-34 are cross sectional side views of a part of a spatial light modulator illustrating a process for fabricating a mirror plate having a first cavity in which are located one or more of hidden hinges, and a second cavity partially covered by a membrane. The cross-sections are viewed along the line A-A' in FIG. 27. Processing steps depicted in FIG. 29-34 are similar to those shown in FIGS. 21-26 except for the additional anti-stiction features including the cavities 1041 and 1051 and the membranes 1040 and 1050. Specifically, referring to FIG. 29, before the sacrificial material 604 is deposited over the hinge layer 605, openings 1042 and 1052 are patterned and etched in the hinge layer 605 (openings 1042 and 1052 are not visible in the cross-sectional views in FIGS. 29-34). As shown in FIG. 30, after the sacrificial material 604 is deposited, it is patterned to leave sacrificial material portions 604a and 604b in the openings 1042 and 1052 and over the torsion hinge layer 605 at the locations where the cavities 1041 and 1051 are to be formed. When an electromechanical layer 608 is deposited, in FIG. 31, two pockets 604a and 604b of sacrificial material are formed in the electromechanical layer 608 on the surface of torsion hinge layer 605. A reflective layer 606 is deposited over torsion hinge layer 605 in FIG. 32. The reflective layer 606 of electromechanical layer is then patterned. Apertures are etched anisotropically through the reflective layer 606, the electromechanical layer 608, and the torsion hinge layer 605 into the sacrificial layer 604 to define a plurality of individual mirrors, as shown in FIG. 33. The sacrificial materials are removed in FIG. 34 to form the openings 1042 and 1052 in the hinge layer 605 and the cavities 1041 and 1051 in the electromechanical layer 608 above the openings 1042 and 1052. Membranes 1040 and 1050 remain, bridging over the cavities 1041 and 1051.

Figure 35:
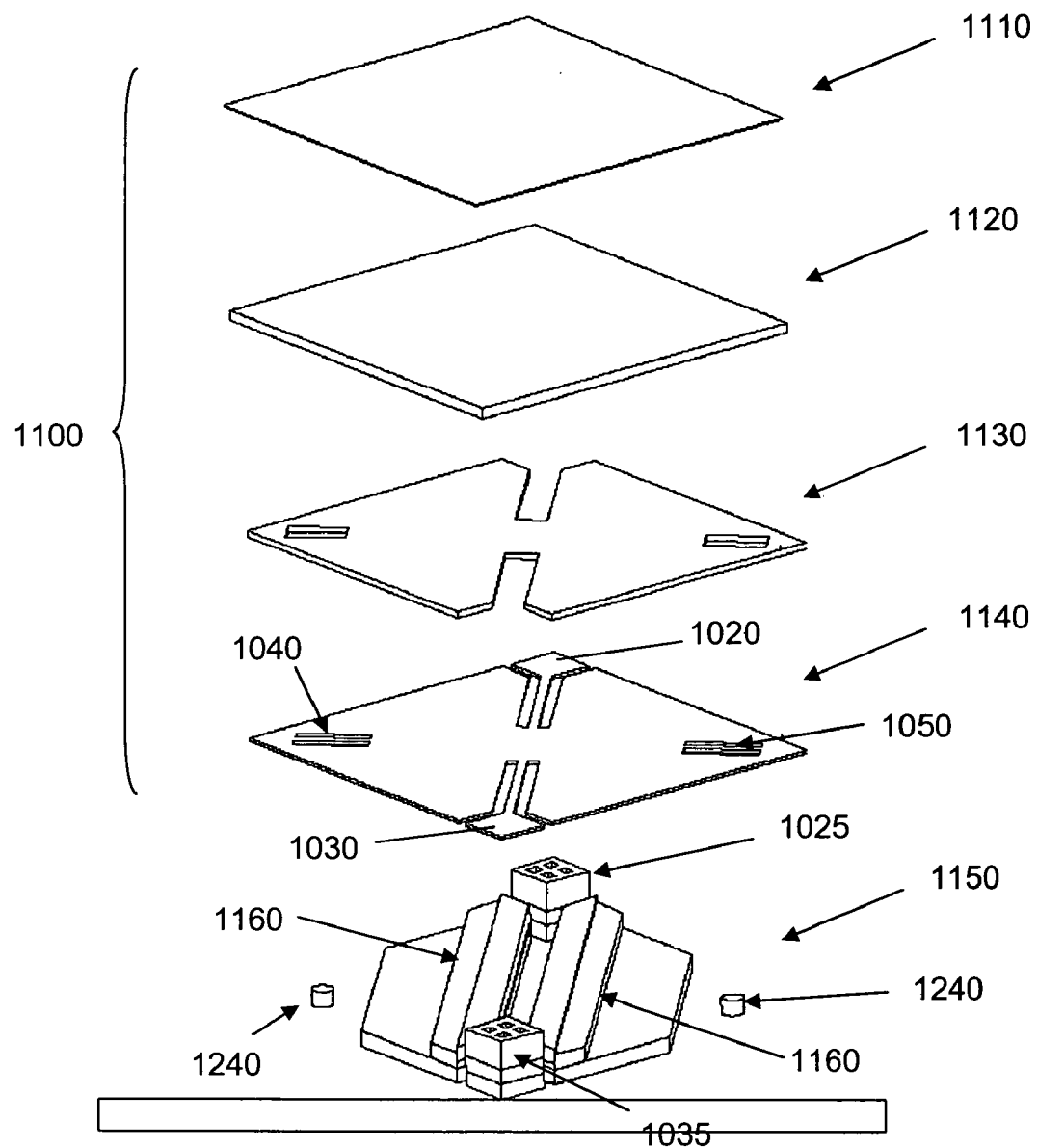
FIG. 35 is an expanded perspective view of the micro-mirror plate and the control substrate.

FIG. 35 is an expanded perspective view of various layers in the micro-mirror plate 1100 and the control substrate 1150. The micro-mirror plate 1100 includes a reflective layer 1110, a plate layer 1120, a spacer layer 1130, and a hinge-membrane layer 1140. The second cavities for anti-stiction and the space layer for the torsional hinges are formed in the spacer layer 1120. The torsional hinges 1020 and 1030 as well as the membranes 1040 and 1050 are formed in the hinge-membrane layer 1140. The control substrate 1150 includes hinge support posts 1025 and 1035, step electrodes 1160, and other components as described above. The landing tips 1240 over the control substrate are in registration with respective membranes 1140 and 1150.

Figure 36:
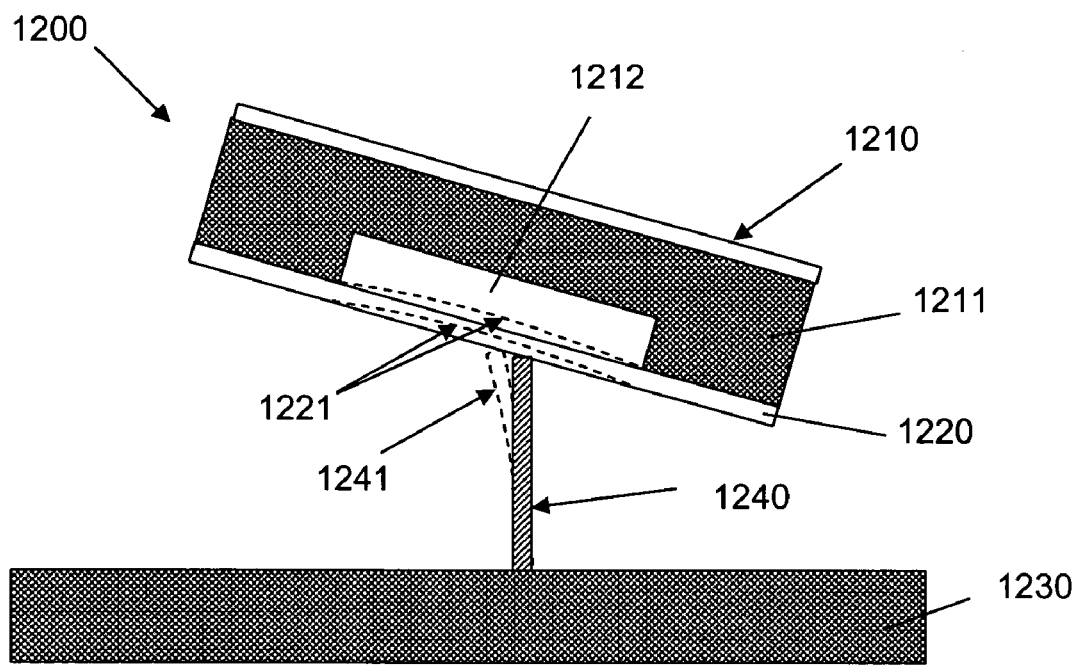
FIG. 36 is an enlarged cross-sectional view of the micro-mirror plate in contact with the landing tips in connection with the control substrate.

FIG. 36 shows an enlarged view of the micro-mirror plate 1200 in tilt angular position in the cross section along line A-A' in FIG. 27. The micro-mirror plate 1200 includes a substrate portion 1211, a reflective top surface layer 1210, a cavity 1212, and a membrane 1220 bridging over the cavity 1212. The tilt of the micro-mirror plate 1200 can be driven by electrostatic forces. A landing tip 1240 fixed to the control substrate 1230 is configured to stop the tilt of micro-mirror plate 1200 by coming in contact with the membrane 1220. The downward electrostatic force exerted over the micro-mirror plate 1200 creates strains in both the membrane 1220 and the landing tip 1240. As a result, the membrane 1220 is distorted to the deformed membrane positions 1221 (depicted by the dashed lines, the distortion is exaggerated in FIG. 36 for the purpose of clarity).

The landing tip 1240 is also bent to the distorted landing tip position 1241 (in dashed lines, the distortion is exaggerated in FIG. 36 for the purpose of clarity). The deformation of the membrane 1220 stores mechanical potential energy in the membrane 1220. The potential energy stored in the membrane 1220 can be released to produce an elastic force that push against the tip of the landing tip 1240 when the electric voltage is removed or reversed between the conductive bottom surface of the micro-mirror plate and the electrodes over the control substrate. Likewise, the bent landing tip 1240 also stores mechanical potential energy that can be released to push away the micro-mirror plate 1200 when the driving electrostatic force is removed or reversed. The release of potential energy (from either the landing tip individually or together, this capability of helps to overcome contact stiction at the contact surfaces and enables a rapid separation between the landing tip 1240 and the membrane 1220.

The disclosed SLM device can include a single landing tip joined to the substrate for stopping the rotation of a mirror plate. The mirror plate can include a cavity and a membrane over the cavity on the lower side of the mirror plate. As described above, the membrane can come to contact with the landing tip to stop the rotation of the mirror plate, when the mirror plate is rotated by an electrostatic force toward the landing plate. The orientation of the mirror plate at which the membrane is in contact with the landing tip defines one angular position of the mirror plate for light modulation. The contact between the landing tip and the membrane stores elastic energies in the deformed membrane and the bent landing tip. The releases of the elastic forces help to overcome the contact stiction between the landing tip and the mirror plate when the mirror plate is rotated away from the landing tip by another electrostatic force. The mirror can be tilted to the horizontal direction or another angular direction, which defines a second state of light modulation by the mirror plate.

Embodiments of the invention and all of the functional operations described in this specification can be implemented in digital electronic circuitry, or in computer software, firmware, or hardware, including the structures disclosed in this specification and their structural equivalents, or in combinations of them. Embodiments of the invention can be implemented as one or more computer program products, i.e., one or more modules of computer program instructions encoded on a computer-readable medium, e.g., a machine-readable storage device, a machine-readable storage medium, a memory device, or a machine-readable propagated signal, for execution by, or to control the operation of, data processing apparatus. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry. The present invention has been described in terms of a preferred embodiment. The invention, however, is not limited to the embodiment depicted and described. Rather, the scope of the invention is defined by the appended claims.

What is claimed is:

1. A spatial light modulator, comprising:
   a mirror plate comprising a reflective upper surface, a lower surface having a conductive surface portion, and a substrate portion having a first cavity having an opening on the lower surface, a second cavity in the substrate portion, and a membrane over the second cavity;
   a substrate comprising an upper surface, a hinge support post in connection with the upper surface, and a hinge component supported by the hinge support post and in connection with the mirror plate to facilitate a rotation of the mirror plate, wherein the hinge component extends into the first cavity; and
   an upright landing tip in connection with the upper surface of the substrate, wherein the upright landing tip is configured to contact the membrane over the second cavity in the substrate portion of the mirror plate to stop the rotation of the mirror plate at a predetermined orientation.

2. The spatial light modulator of claim 1, wherein the first cavity in the substrate portion of the mirror plate and the associated hinge component are configured such that a gap is between the hinge component and the surfaces in the first cavity to permit the rotation of the mirror plate.

3. The spatial light modulator of claim 1, further comprising an electrode over the upper surface of the substrate.

4. The spatial light modulator of claim 3, wherein the upright landing tip is configured to contact the membrane over the second cavity in the substrate portion of the mirror plate to stop the rotation of the mirror plate at a predetermined orientation when an electric voltage is applied between the electrode over the substrate and the conductive surface portion in the lower surface of the mirror plate.

5. The spatial light modulator of claim 4, wherein the membrane over the second cavity in the substrate portion of the mirror plate is configured to be deformed by the upright landing tip when the mirror plate is pulled by an electrostatic force produced by the electric voltage and stopped by the upright landing tip.

6. The spatial light modulator of claim 5, wherein the membrane is configured to restore the deformation and to produce an elastic force against the upright landing tip.

7. The spatial light modulator of claim 1, wherein the membrane partially covers the second cavity in the substrate portion of the mirror plate, leaving one or more openings in the second cavity at the lower surface of the mirror plate.

8. The spatial light modulator of claim 1, wherein the membrane comprises a material selected from the group consisting of titanium, tantalum, tungsten, molybdenum, silicon, amorphous silicon, polysilicon, and silicon nitride.

9. The spatial light modulator of claim 1, wherein the membrane over the second cavity of the substrate portion of the mirror plate consists of substantially the same material as the substrate portion of the mirror plate.

10. The spatial light modulator of claim 1, wherein the membrane over the second cavity and the hinge component comprise substantially the same material composition.

11. The spatial light modulator of claim 10, wherein the membrane over the second cavity and hinge component have a different material composition from the material composition in the substrate portion of the mirror plate.

12. The spatial light modulator of claim 1, wherein the substrate comprises two hinge support posts and two hinge components each supported by one of the hinge support posts, each of the hinge components being configured to extend into a first cavity in the substrate portion of the mirror plate.

13. The spatial light modulator of claim 12, wherein the mirror plate is configured to rotate around an axis defined by the two hinge components positioned in the two first cavities plate.

14. The spatial light modulator of claim 1, wherein the substrate comprises a first electrode and a second electrode over the upper surface.

15. The spatial light modulator of claim 14, wherein the substrate portion of the mirror plate comprises two or more second cavities each at least partially covered by a membrane.

16. The spatial light modulator of claim 15, wherein the mirror plate is configured to rotate in a first direction when a first electric voltage is applied across the first electrode and the conductive surface portion in the lower surface of the mirror plate and the mirror plate is configured to rotate in a second direction when a second electric voltage is applied across the second electrode and the conductive surface portion in the lower surface of the mirror plate.

17. The spatial light modulator of claim 16, wherein the modulator includes a plurality of upright landing tips and a first one of the plurality of upright landing tips is configured to stop the mirror plate rotating in the first direction by contacting a first membrane over one of the second cavities and a second one of the plurality of upright landing tips is configured to stop the mirror plate rotating in the second direction by contacting a second membrane over another one of the second cavities.

18. The spatial light modulator of claim 1, wherein the mirror plate, the hinge component, or the hinge support post comprises a material selected from the group consisting of aluminum, silicon, amorphous silicon, polysilicon, and an aluminum-silicon alloy.

19. A spatial light modulator, comprising:
a two-dimensional array of mirror plates, each comprising a reflective upper surface, a lower surface having a conductive surface portion, and a substrate portion having one or more first cavities having openings on the lower surface, one or more second cavities in the substrate portion, and membranes over the second cavities;
a substrate comprising an upper surface, a plurality of electrodes over the upper surface, a plurality of hinge support posts over the upper surface, and a plurality of hinge components each supported by one of the hinge support posts, wherein each of the hinge components is configured to extend into the first cavities in the substrate portion of one of the mirror plates in the two-dimensional array to facilitate a rotation of the mirror plate; and
a plurality of upright landing tips in connection with the upper surface of the substrate, wherein each of the upright landing tips is configured to contact one of the membranes over the second cavities in the substrate portion of one of the mirror plates to stop the rotation of the mirror plate at a predetermined orientation when an electric voltage is applied across one of the electrodes over the substrate and the conductive surface portion in the lower surface of the mirror plate.

20. The spatial light modulator of claim 19, wherein the plurality of electrodes and the plurality of upright landing tips in connection with the upper surface of the substrate are disposed in two-dimensional arrays in registration with the two dimensional array of mirror plates.

21. The spatial light modulator of claim 20, wherein one or more electrodes over the substrate are disposed under each of the mirror plates and are configured to cause the mirror plate to rotate when the electric voltage is applied across the one of the electrodes over the substrate and the conductive surface portion in the lower surface of the mirror plate.

22. The spatial light modulator of claim 19, wherein the substrate comprises a first electrode and a second electrode over the upper surface corresponding to one of the mirror plates in the two dimensional array, wherein the mirror plate is configured to rotate in a first direction when a first electric voltage is applied across the first electrode and the conductive surface portion in the lower surface of the mirror plate and to rotate in a second direction when a second electric voltage is applied across the second electrode and the conductive surface portion in the lower surface of the mirror plate.

23. The spatial light modulator of claim 19, wherein the membrane comprises a material selected from the group consisting of titanium, tantalum, tungsten, molybdenum, an alloy, silicon, amorphous silicon, polysilicon, and silicon nitride.

24. The spatial light modulator of claim 19, wherein the membrane over the second cavity and the hinge component comprise substantially the same material composition.

25. The spatial light modulator of claim 24, wherein the membrane over the second cavity and hinge component comprise a different material composition from the material composition in the substrate portion of the mirror plate.

* * * * *